(12) United States Patent
Atwater et al.

(10) Patent No.: US 9,455,146 B2
(45) Date of Patent: Sep. 27, 2016

(54) VIRTUAL SUBSTRATES FOR EPITAXIAL GROWTH AND METHODS OF MAKING THE SAME

(75) Inventors: Harry A. Atwater, South Pasadena, CA (US); Marina S. Leite, Pasadena, CA (US); Emily C. Warmann, Riverside, CA (US); Dennis M. Callahan, Los Angeles, CA (US)

(73) Assignee: California Institute of Technology, Pasadena, CA (US)

( * ) Notice: Subject to any disclaimer, the term of this patent is extended or adjusted under 35 U.S.C. 154(b) by 797 days.

(21) Appl. No.: 12/928,762

(22) Filed: Dec. 17, 2010

(65) Prior Publication Data
US 2011/0193195 A1 Aug. 11, 2011

Related U.S. Application Data

(60) Provisional application No. 61/287,655, filed on Dec. 17, 2009, provisional application No. 61/322,179, filed on Apr. 8, 2010, provisional application No. 61/351,251, filed on Jun. 3, 2010.

(51) Int. Cl.
*H01L 29/06* (2006.01)
*H01L 21/18* (2006.01)

(52) U.S. Cl.
CPC .................. *H01L 21/187* (2013.01)

(58) Field of Classification Search
USPC ........................................................ 257/615
See application file for complete search history.

(56) References Cited

U.S. PATENT DOCUMENTS

| | | | |
|---|---|---|---|
| 6,596,377 B1 * | 7/2003 | Hersee et al. | 428/195.1 |
| 6,921,914 B2 | 7/2005 | Cheng et al. | |
| 6,995,427 B2 * | 2/2006 | Aulnette et al. | 257/345 |
| 6,995,430 B2 * | 2/2006 | Langdo et al. | 257/352 |
| 7,138,325 B2 * | 11/2006 | Maleville et al. | 438/607 |
| 7,495,313 B2 * | 2/2009 | Nayfeh et al. | 257/593 |
| 7,585,792 B2 * | 9/2009 | Celler | 438/795 |
| 8,105,916 B2 * | 1/2012 | Faure | 438/458 |
| 2005/0130424 A1 | 6/2005 | Bedell et al. | |
| 2010/0025728 A1 | 2/2010 | Faure | |
| 2010/0072515 A1 * | 3/2010 | Park et al. | 257/190 |

OTHER PUBLICATIONS

International Search Report and Written Opinion for International Application No. PCT/US2010/06166, dated Aug. 26, 2011, 9 pgs.
Clawson, A.R., "R Reports: A Review Journal, Guide to references on III-V semiconductor chemical etching," *Materials Science and Engineering*, vol. 31 (2001) pp. 1-438.
Yablonovitch, Eli, et al., "Extreme selectivity in the lift-off of epitaxial GaAs films," *Appl. Phys. Lett.*, vol. 51, No. 26, Dec. 28, 1987, pp. 2222-2224.

(Continued)

*Primary Examiner* — Eugene Lee
(74) *Attorney, Agent, or Firm* — Lewis Roca Rothgerber Christie LLP

(57) ABSTRACT

A virtual substrate includes a handle support and a strain-relieved single crystalline layer on the handle support. A method of making the virtual substrate includes growing a coherently-strained single crystalline layer on an initial growth substrate, removing the initial growth substrate to relieve the strain on the single crystalline layer, and applying the strain-relieved single crystalline layer on a handle support.

11 Claims, 25 Drawing Sheets
(24 of 25 Drawing Sheet(s) Filed in Color)

(56) References Cited

OTHER PUBLICATIONS

Roberts, Michelle M., et al., "Elastically relaxed free-standing strained-silicon nanomembranes," *Nature Materials*, vol. 5, May 2006, pp. 388-393.

Marée, P. M. J. et al., Generation of misfit dislocations in semiconductors, journal, Dec. 1, 1987, J. Appl. Phys., 9 pages, vol. 62, No. 11, 1987 American Institute of Physics.

Matthews, J. W. et al., Defects in Epitaxial Multilayers—I. Misfit Dislocations, journal, Mar. 6, 1974, 8 pages, Journal of Crystal Growth 27 (1974), North-Holland Publishing Co.

Matthews, J. W. et al., Defects in Epitaxial Multilayers—II. Dislocation Pile-Ups, Threading Disclocations, Slip Lines and Cracks, journal, Jul. 25, 1974, 8 pages, Journal of Crystal Growth 29 (1975), North-Holland Publishing Co.

Tersoff, J., Dislocations and strain relief in compositionally graded layers, journal, Feb. 15, 1993, 4 pages, Appl. Phys. Lett. 62, No. 7, 1993 American Institute of Physics.

Tersoff, J. et al., Competing Relaxation Mechanisms in Strained Layers, letter, May 30, 1994, 5 pages, Physical Review Letters, vol. 72, No. 22, 1994 The American Physical Society.

\* cited by examiner

VIRTUAL SUBSTRATES FOR EPITAXIAL GROWTH AND METHODS OF MAKING THE SAME

CROSS-REFERENCE TO RELATED APPLICATION

This application claims priority to and the benefit of U.S. Provisional Application Ser. Nos. 61/287,655, filed on Dec. 17, 2009, 61/322,179, filed on Apr. 8, 2010, and 61/351,251, filed on Jun. 3, 2010, the entire contents of both of which are incorporated herein by reference.

STATEMENT OF FEDERALLY FUNDED RESEARCH

The Federal government has certain rights in this invention pursuant to Department of Energy Grant No. DE-FG36-08GO18071.

TECHNICAL FIELD

This application is directed to virtual substrates for epitaxial growth and methods of making the virtual substrates.

TECHNICAL BACKGROUND

Semiconductor epitaxial alloys are widely used in solid state applications. For example, defect-free III-V compound semiconductor alloys are responsible for the widespread application of a vast array of optoelectronic devices, including semiconductor lasers, light-emitting diodes, and solar cells. One of the key technological requirements for achieving high quality optoelectronic materials and devices is the epitaxial crystal growth. However, the versatility of semiconductor epitaxial growth is restricted by the limited number of single crystal substrates available in bulk form. Indeed, the limited number of single crystal substrates available in bulk form is currently an obstacle to the development of high quality semiconductor heterostructures as the variety of compositions and lattice parameters is restricted to those available as single crystal substrates in bulk form. Therefore, although the ability to modify, control, or tune, the lattice parameter, band gap or band offset of the substrate used in the epitaxial growth process would be ideal, it has been unattainable due to the limitations on available single crystal substrates. Such control, or tunability, would, for example, enable the fabrication of optoelectronic devices with unique characteristics, such as semiconductor lasers, thin film solar cells, and photonic crystals, among others. Unfortunately, the currently limited variety of available single crystal substrates is stifling such development.

In a coherent epitaxial growth process, the deposited material assumes the substrate crystal structure and lattice parameter, and the grown film is free of strain-relieving dislocations. The lattice parameter of the deposited film in the parallel direction ($a_{\parallel}$) is equal to that of the substrate ($a_{sub}$), and the lattice parameter in the perpendicular direction ($a_{\perp}$) is free to expand or contract due to the existence of a traction-free top surface and the Poisson effect, which preserves the material unit cell volume V (FIG. 1A). For a cubic symmetry, $V = a_{film}^3 = a_{\perp} a_{\parallel}^2$, where $a_{film}$ is the lattice parameter of the relaxed film, the lattice mismatch between the film and the substrate induces a tetragonal distortion in the epitaxial film, defined as strain [$\epsilon_{\parallel} = (a_{\parallel} - a_{film})/a_{film}$]. If the film's natural lattice parameter ($a_{film}$) is smaller than that of the substrate ($a_{sub}$), it is tensile with respect to the substrate, and therefore the strain value is greater than zero (i.e., $\epsilon_{\parallel} > 0$). Conversely, if the film's natural lattice parameter ($a_{film}$) is larger that that of the substrate ($a_{sub}$), it is compressed with respect to the substrate, and therefore the strain value is less than zero (i.e., $\epsilon_{\parallel} < 0$). Any material that is lattice-mismatched to the substrate will be strained, causing an increase in the elastic energy of the system. If the elastic energy exceeds the energy associated with the introduction of defects such as dislocations, these defects can be introduced into the film to minimize the overall energy. However, the defects compromise the quality of the crystal, and consequently the device's performance.

Armed with this knowledge base, substantial research has been dedicated to the development of a defect-free crystalline substrate with a tunable lattice parameter for use as a template for epitaxial semiconductor growth. To date, however, none of these efforts have proven successful. For example, considerable effort has been devoted to the growth of graded layers in order to achieve a final lattice parameter distinct from that of the substrate initially used. However, this technique requires the growth of additional non-active layers, and depending on the growth conditions, may lead to dislocations.

Other prior efforts to make epitaxial growth substrates for Chemical Vapor Deposition (CVD) growth of materials with lattice constants different from those of single crystal wafers were based on a compliant substrate concept. This consisted of placing a thin layer of a crystal template on a planar support with a low viscosity interface between the two materials. However, the crystal template did not have the desired lattice constant. Instead, the layer was designed to be much thinner than the desired layers of CVD grown material. As the epitaxial growth process progressed, dislocations caused by the lattice mismatch strain between the template material and the growth material would be segregated into the thin template, allowing the growth material to attain its natural lattice constant with a low density of defects. The concept called for the low viscosity layer to allow the thin template to slip on the planar support and accommodate the mismatch strain. In reality, though, the interface between the crystal template and the planar support was not capable of allowing sufficient slip over the area of the entire compliant substrate. As such, this concept was not able to support the growth of large areas of single-crystal material.

In a different approach, high temperature annealing of a glass compound was used to enable strain relief of Si—Ge epitaxial films by means of elastic strain relief, but film buckling was consistently observed. Indeed, heat treatments over 400° C. cannot be performed on III-V semiconductor compound films without plastic deformation of the alloy films.

According to yet another approach, relaxation of $In_xGa_{1-x}As$ strained regions was achieved in selectively etched mesas that allowed very small areas of the film (300×300 μm$^2$) to relax. However, although the film relaxes, it is trapped between other mesas, significantly limiting its applicability to device fabrication.

In an alternative approach, a free-standing, elastically-strained nanomembrane was achieved by growing a tri-layer of Si/Si$_x$Ge$_{1-x}$/Si, and relieving the tri-layer from the original substrate. In these laminate structures, elastic strain is partitioned among the layers of the tri-layer to achieve elasto-mechanical equilibrium. Although these structures can enable control of silicon band offsets, these templates consist of a combination of strained layers in a strain-balanced laminate, and none of the layers relax to their native lattice parameters nor is the laminate a single crystal substrate or a template for epitaxial growth.

SUMMARY

In some embodiments of the present invention, a virtual substrate for use as a template for epitaxial growth of optoelectronic devices and the like includes a handle support and a substantially strain-relieved single crystalline layer on the handle support. The single crystalline layer may include any suitable material, for example, the material may be selected from III-V semiconductor materials, II-VI semiconductor materials, IV-IV semiconductor materials, and ceramic semiconductor materials. In some embodiments, for example, the single crystalline layer includes a III-V semiconductor material, e.g., an alloy of In, Ga and As.

In other embodiments of the present invention, a method of forming a virtual substrate includes growing a coherently-strained single crystalline layer on an initial growth substrate, removing the initial growth substrate to form a substantially strain-relieved single crystalline layer, and applying the substantially strain-relieved single crystalline layer to a handle support.

The method may further include applying a transfer support to the coherently-strained single crystalline layer prior to removing the initial growth substrate, and the transfer support may include any suitable material, such as, for example, waxes, greases, polymers, adhesives and adhesive tapes. The transfer support is removed after applying the substantially strain-relieved single crystalline layer to the handle support.

The substantially strain-relieved single crystalline layer may be applied to the handle support by applying water to the substantially strain-relieved single crystalline layer and/or the handle support, and allowing a van der Waals bond to form between the substantially strain-relieved single crystalline layer and the handle support. The substantially strain-relieved single crystalline layer and/or the handle support may also be heated during formation of the van der Waals bond to convert the van der Waals bond to a covalent bond.

In alternate embodiments, the method includes applying a sacrificial layer on the initial growth substrate and growing the coherently-strained single crystalline layer on the sacrificial layer. According to this method, the initial growth substrate is removed from the coherently-strained single crystalline layer by removing (e.g. by selective etching) the sacrificial layer. This method may also include applying a transfer support to the coherently-strained single crystalline layer prior to removing the sacrificial layer, and then removing the transfer support after applying the substantially strain-relieved single crystalline layer to the handle support.

In still other embodiments, the method includes implanting $H^+$ or $He^+$ ions in the initial growth substrate after growing the coherently-strained film. According to this method, the initial growth substrate is removed from the coherently-strained single crystalline layer by heating the initial growth substrate and coherently-strained single crystalline layer after implanting the ions. The heat triggers exfoliation of the initial growth substrate, which results in removal of all but a thin layer of the initial growth substrate from the coherently-strained single crystalline layer. The thin layer of the initial growth substrate may then be removed from the coherently-strained single crystalline layer by, e.g., selective etching. This method may also include applying a transfer support to the coherently-strained single crystalline layer prior to heating the initial growth substrate and coherently-strained single crystalline layer, and then removing the transfer support after applying the substantially strain-relieved single crystalline layer to the handle support.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

Figure 1A:
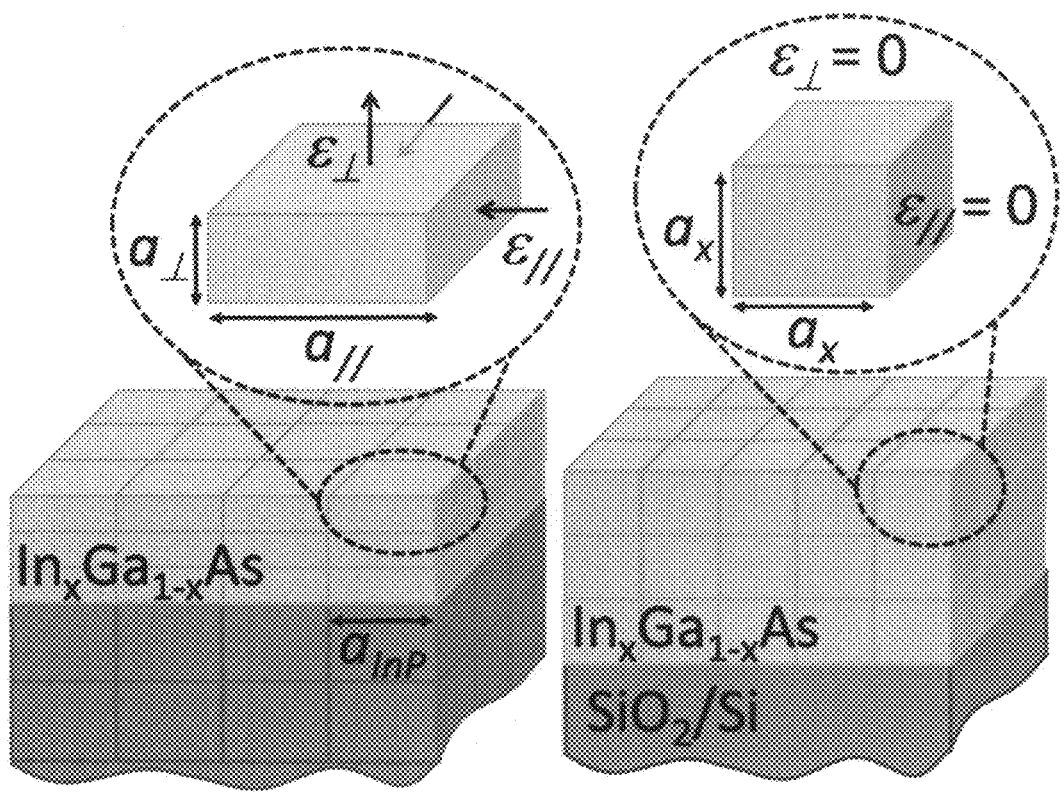
FIG. 1A is a schematic illustrating the in-plane and out-of-plane strain in an $In_xGa_{1-x}As$ film grown on an InP substrate and the relaxation of the strain in the $In_xGa_{1-x}As$ film when transferred to a $SiO_2/Si$ handle support according to an embodiment of the present invention.

In embodiments of the present invention, a virtual substrate includes a handle support and a single crystalline layer. The single crystalline layer is substantially free of strain, and the substrate can be used as a template for epitaxial growth. Throughout this disclosure, the inventive substrates may be termed "virtual substrates," and as used herein, the term "virtual substrate" refers to a substrate including a single crystalline layer that is substantially free of strain and has its natural lattice parameter. Also, as used herein, the term "single crystalline layer" refers to a single layer of crystalline material having a lattice parameter distinct from the wafer substrate (also termed "handle support," "handling support," or "handle substrate," all of which terms are used interchangeably herein). Specifically, the term "single crystalline layer" refers to a single layer of a single material, although the single material may be a compound alloy or other compound system of elements. The term "substantially" is used to convey the inherent degree of potential error or deviation in the calculations and measurements used to arrive at the reported values for the identified parameters. For example, the term "substantially free of strain" indicates that the material has no strain, or if there is some strain, it is negligible. Similarly, the term "substantially relaxed" indicates that the material has relaxed to a state in which there is no strain, or only a negligible amount of strain. However, where a material is referred to as "free of strain" or "fully relaxed," the material is completely free of measurable strain or is relaxed to a state in which no strain is measured. Additionally, throughout the disclosure and claims, the terms "relaxed" and "elastically-relaxed" are used interchangeably, such that where a film is referred to as "relaxed," the film is "elastically-relaxed."

The handle support can be any material suitable for mechanically supporting the single crystalline layer. As would be understood by those of ordinary skill the art, the handle support should be compatible with the device and/or reactor used for the epitaxial growth process. In some embodiments, for example, the handle support is compatible for use in chemical vapor deposition apparatuses and/or in molecular beam and/or vapor phase epitaxial equipment. the handle support may also be selected based on cost considerations. A nonlimiting example of a suitable handle support is a SiO$_2$/Si wafer (i.e., a Si wafer coated with a layer of SiO$_2$). Incidentally, in addition to being suitable for use in most growth reactors, SiO$_2$/Si wafers are also relatively inexpensive. The selection of the handle support is dependent on the growth reactor used to effect subsequent epitaxial growth of the single crystalline layer of the virtual substrate. The various handle supports (also termed "handling supports" or "handle substrates") for different growth reactors are well known in the relevant field, and the selection of an appropriate such handle support is within the knowledge and skill of one of ordinary skill in this field.

Historically, a crystalline wafer, such as GaAs, Si, etc, has been used for the epitaxial growth, which is one of the main limitations of epitaxial growth. However, according to embodiments of the present invention, any support that is inert upon in-situ heating used during cleaning procedures and that can fit the sample holder in a reactor can be used as the handle substrate. The handle substrate should be flat to prevent virtual substrate buckling. Also, as would be understood by those of ordinary skill in the art, the handle material may be selected based on the coefficient of thermal expansion, cost, and optical or electronic properties. Additionally, the inventive virtual substrates can be used to integrate different material systems on the same wafer with high quality. In such a case, a handle substrate would be selected based on its suitability for this application. In general, however, the handle substrate should be substantially planar, compatible with the growth/process temperatures, a material that won't contaminate the growth or other processes, and have a thermal expansion coefficient that is reasonably close to the single crystalline layer. Some nonlimiting examples of suitable handle substrates include sapphire, quartz, GaP or Ge.

The material for the single crystalline layer is not particularly limited, and can be selected based on the desired properties of the layer. Specifically, the material of the single crystalline layer may be selected based on the properties specifications required by the intended application of the layer. This ability is a unique and highly desirable aspect of the virtual substrates of the present invention. In particular, the ability to individually select, or tune, the lattice parameters, band gaps or band offsets of the single crystalline layer used for later epitaxial growth enables the production of high quality optoelectronic devices with optical characteristics not available by using conventional substrates as a starting point for the epitaxial growth. Although the techniques of the present invention are applicable across the semiconductor material spectrum, in some embodiments, the single crystalline layer may include a III-V, II-VI or IV-IV compound semiconductor material or ceramic.

The single crystalline layer is formed by first fabricating a coherently-strained semiconductor layer by known methods (e.g., by epitaxial growth on a bulk crystal substrate) and transferring the layer from the growth substrate to a handle support, thereby relieving the strain on the layer. Accordingly, the material of the single crystalline layer is limited only to those materials that can be grown as a coherently-strained film. Such materials are well known in the semiconductor field, and would be understood by those of ordinary skill in the art. As noted above, some such materials include III-V, II-VI or IV-IV compound semiconductor materials and ceramics, but the present invention is not limited to these materials, and any material capable of being grown in a strained state can be used to form the single crystalline layer. Indeed, growth of coherently-strained semiconductor films has been widely demonstrated with a wide range of materials, such that the grown coherently-strained film can be achieved with a wide range of materials, as would be understood by those of ordinary skill in the art.

Once transferred to the handle support, the single crystalline layer is substantially free of strain and becomes a substantially strain-relieve single crystalline layer. As used herein, the term "substantially strain-relieved single crystalline layer" refers to a single crystalline layer that is grown under biaxial strain to form an initial coherently-strained layer, and then relieved of the strain by transferring the initial grown layer to a separate handle support. Specifically, the single crystalline layer is substantially relaxed such that the material of the layer assumes its bulk properties, as predicted by Vegard's law. Vegard's law predicts the lattice parameter of a compound semiconductor material based on the constituent elements of the semiconductor alloy. In particular, Vegard's law establishes a linear relationship between the lattice parameter of the alloy and the concentrations of the constituent elements. For example, according to Vegard's law, the lattice parameter (a) of an alloy of InGaAs follows the formula:

$$a_{InGaAs} = x(a_{InGa}) + (1-x)a_{InAs}$$

According to embodiments of the present invention, the single crystalline layer includes a compound semiconductor material that is substantially free of strain, and has a lattice parameter that substantially matches the one predicted by Vegard's law.

The thickness of the single crystalline layer is not particularly limited. However, the layer should be thin enough to resist cracking or deformation. Indeed, the more highly strained the layer is, the thinner the layer must be to avoid the formation of dislocations or defects. Also, the tendency of the layer to form cracks will increase with increasing thickness. Consequently, the thinnest possible layer is the most desirable, and also reduces costs. In some embodiments, for example, the layer has a thickness up to about 3 microns. For example, the layer may have thickness ranging from about 30 nm to about 1 micron. In some exemplary embodiments, the single crystalline layer has a thickness ranging from about 40 nm to about 80, and in some embodiments, the thickness is about 40 nm. While the single crystalline layer may have thicknesses of 30 nm or less, handling such ultrathin films without damaging them can be challenging. On the other hand, while the single crystalline layer may also have thicknesses up to about 3 microns, fabricating an original coherently-strained film substantially free of dislocations at that thickness can be challenging. This fabrication depends on the kinetic growth conditions, which can be achieved by tuning the deposition rate and the temperature during the epitaxial growth, and strongly depends on the components of the alloy forming the film.

Figure 1B:
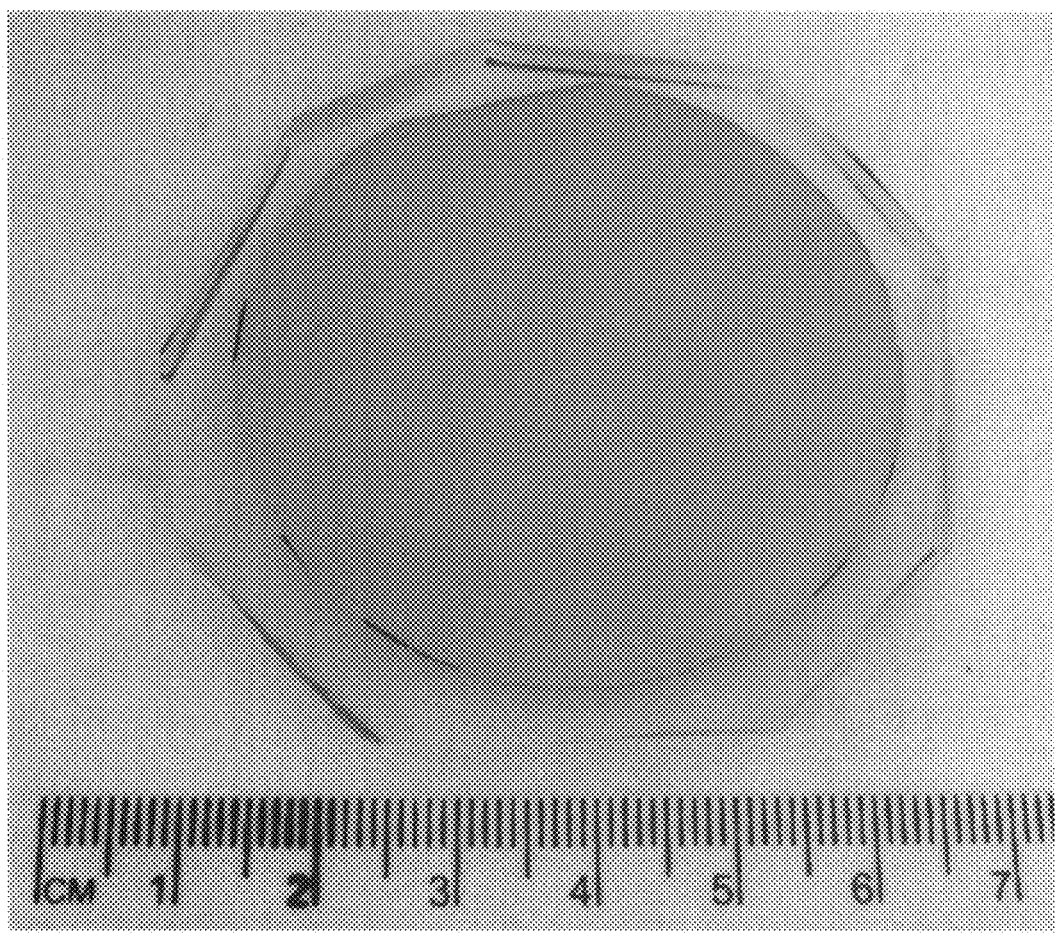
FIG. 1B is a photograph of a 50 mm diameter $In_{0.43}Ga_{0.57}As$ virtual substrate template according to an embodiment of the present invention.

The virtual substrates of the present invention can be scaled up to wafer-size, as shown in FIG. 1B. Indeed, the virtual substrates can be made in any desired size or shape. The size of the virtual substrate is, of course, dictated by the size of the initial growth substrate, and consequently the size of the grown film. In some exemplary embodiments, however, the virtual substrates can have single crystalline layers with diameters (or dimensions) up to about 50 mm or about 2 inches. In other exemplary embodiments, the virtual substrates can have single crystalline layers with diameters or dimensions measuring from about 1 cm to about 50 mm. In some embodiments, for example, the virtual substrates can have single crystalline layers with a diameter or dimension of about 2 mm.

Figure 5:
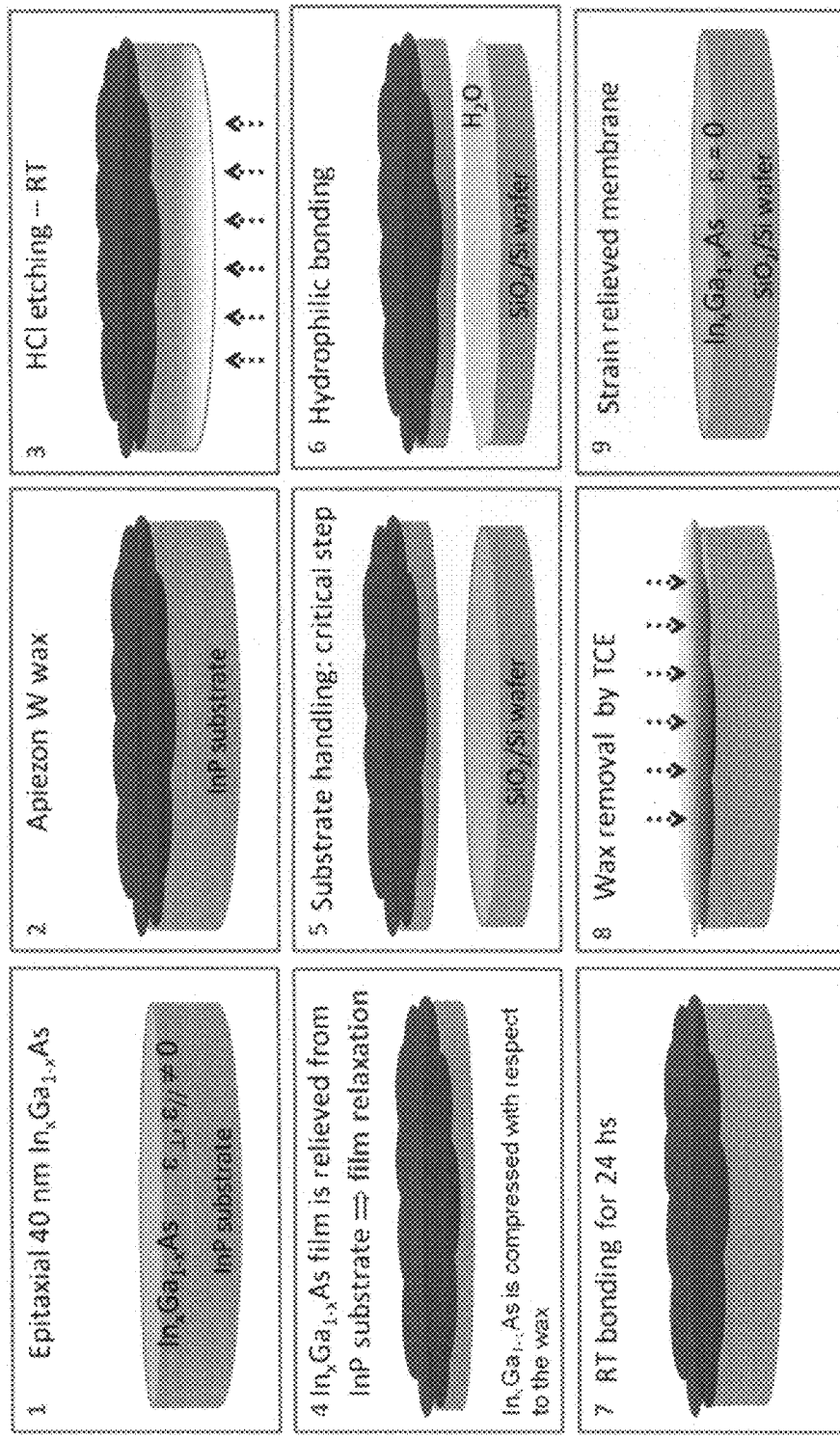
FIG. 5 is an illustration of a method of fabricating a virtual substrate according to an embodiment of the present invention.

According to some embodiments of the present invention, a method of fabricating a virtual substrate for epitaxial growth enables the production of large areas (e.g., 20 mm in diameter or greater, such as 50 mm) of substantially dislocation-free, fully or substantially relaxed single crystalline compound semiconductor (e.g., $In_xGa_{1-x}As$) layers with lattice parameters equal to the bulk value predicted by Vegard's law (e.g., the bulk $In_xGa_{1-x}As$ value). As shown in FIG. 5, in some embodiments, a method of making a virtual substrate includes growing a coherently-strained film on an initial growth substrate (shown in box 1). During growth of the coherently-strained film, the film is distorted to match the parallel lattice parameter of the initial growth substrate, yielding a strain value for the grown film that is not equal to zero (also shown in box 1). The initial growth substrate is then removed to relax the grown film (shown in boxes 2-4), and then the relaxed film is applied on a separate handle support (shown in boxes 5-9).

By removing the initial growth substrate from the film, the elastic strain ($\epsilon$) is relieved and the crystal assumes its predicted bulk lattice parameter, as shown in FIG. 1A. Indeed, FIG. 1A shows that the strain value of the grown film while it remains on the initial growth substrate is not equal to zero, and shows that upon removal from the initial growth substrate and placement on a handle support, the grown film relaxes to a state in which the strain is zero (or about zero). The biaxial in-plane distortion affects the energy band gap of the alloy, as observed in optical measurements, such as those shown in FIGS. 4A and 4B. These methods can be used to create virtual substrates using any semiconductor alloy.

Growing the Coherently-Strained Film

To grow the coherently-strained film, a layer of the desired material is grown on an initial growth substrate by any suitable method, as would be known to those of skill in the art. For example, the film may be heteroepitaxially grown using chemical vapor deposition, molecular beam epitaxy, etc. Any desired material may be grown in this manner, and the layer grown on the initial growth substrate serves as the single crystalline layer in the resultant virtual substrate. Accordingly, the materials of the coherently-strained film are the same as the materials of the single crystalline layer, discussed above. Additionally, as the coherently-strained film is subsequently removed from the initial growth substrate and applied to a separate handle support, the thickness of the coherently-strained film is substantially the same as that of the single crystalline layer.

Due to the epitaxial growth process, the film grown on the initial growth substrate takes on the parallel lattice parameter ($a_\parallel$) of the initial growth substrate. However, the initial growth substrate has a lattice parameter different from the one predicted by Vegard's law (the predicted bulk crystal lattice parameter) for the grown film. As such, the difference in the actual lattice parameter of the film and the predicted bulk crystal lattice parameter results in biaxial strain in the grown film. This strain occurs due to the compensation of deformations in the in-plane lattice parameter ($a_\parallel$) by distortion of the out-of-plane parameter ($a_\perp$) to conserve the unit cell volume. This phenomenon is illustrated in FIG. 1A with respect to an $In_xGa_{1-x}As$ film grown on an InP substrate. As can be seen in FIG. 1A, the out-of-plane lattice parameter ($a_\perp$) compensates for the deformation of the in-plane lattice parameter ($a_\parallel$), thereby conserving the unit cell volume of the grown $In_xGa_{1-x}As$ film, but resulting in biaxial strain (i.e, $\epsilon_\parallel, \epsilon_\perp \neq 0$). Accordingly, growth of the film on the initial growth substrate results in a coherently-strained film on the initial growth substrate.

As discussed above, the materials of the coherently-strained film are the same as the materials of the single crystalline layer. As also discussed above, growth of coherently-strained semiconductor films has been widely demonstrated with a wide range of materials, such that the grown coherently-strained film can be achieved with a wide range of materials, as would be understood by those of ordinary skill in the art. A few, nonlimiting examples of these include $Si_xGe_{1-x}$ layers grown on bulk Si, $In_xGa_{1-x}P$ and $In_xGa_{1-x}As$ alloys on GaAs substrates, $In_xAl_{1-x}As$ alloys in other fields, etc.

Removal of the Initial Growth Substrate

According to embodiments of the present invention, after growth of the coherently-strained film on the initial growth substrate, the initial growth substrate is then removed from the film to relieve the strain on the film. Upon removal of the initial growth substrate, the strained film relaxes to its bulk value as predicted by Vegard's law, and can then be transferred to a handle support to create the virtual substrate. The initial growth substrate may be removed by any suitable method, for example by etching with any suitable material, e.g., room temperature, concentrated HCl. As discussed above, and as would be understood by those of ordinary skill in the art, the selection of the initial growth substrate depends on the desired material of the grown film, and it is within the skill of those of ordinary skill in the art to select an appropriate initial growth substrate for the desired grown film. In addition, once an initial growth substrate is selected, it is within the skill and knowledge of those of ordinary skill in the art to select an appropriate etching process and etching chemical to achieve selective etching of the substrate. Indeed, etch selectivity (which allows selective removal of the initial growth substrate without affecting the grown film) is known to be present in a wide range of materials, and selective etching is a commonly used tool in semiconductor manufacture. Also, etch selectivity with respect to III-V semiconductor materials is discussed in more detail in Clawson, "Guide to references on III-V semiconductor chemical etching," Materials Science and Engineering, 31 (2001) 1-438, the entire content of which is incorporated herein by reference. As such, a chemistry can be found by those of ordinary skill in the art to work with nearly any substrate/film combination. In addition, any dry selective etching can also be used, as long as it does not attack the single crystalline film. Dry etching techniques are commonly used in Si and III-V semiconductor industries. However, while the selection of the material for the initial growth substrate and an appropriate etching process and chemical for that material is within the skill and knowledge of those of ordinary skill in the art, the ability to successfully remove the initial growth substrate from the grown film would not have been appreciated. In particular, as discussed in the background above, prior attempts to relax the grown film by selectively etching mesas were not successful.

Figure 7A:
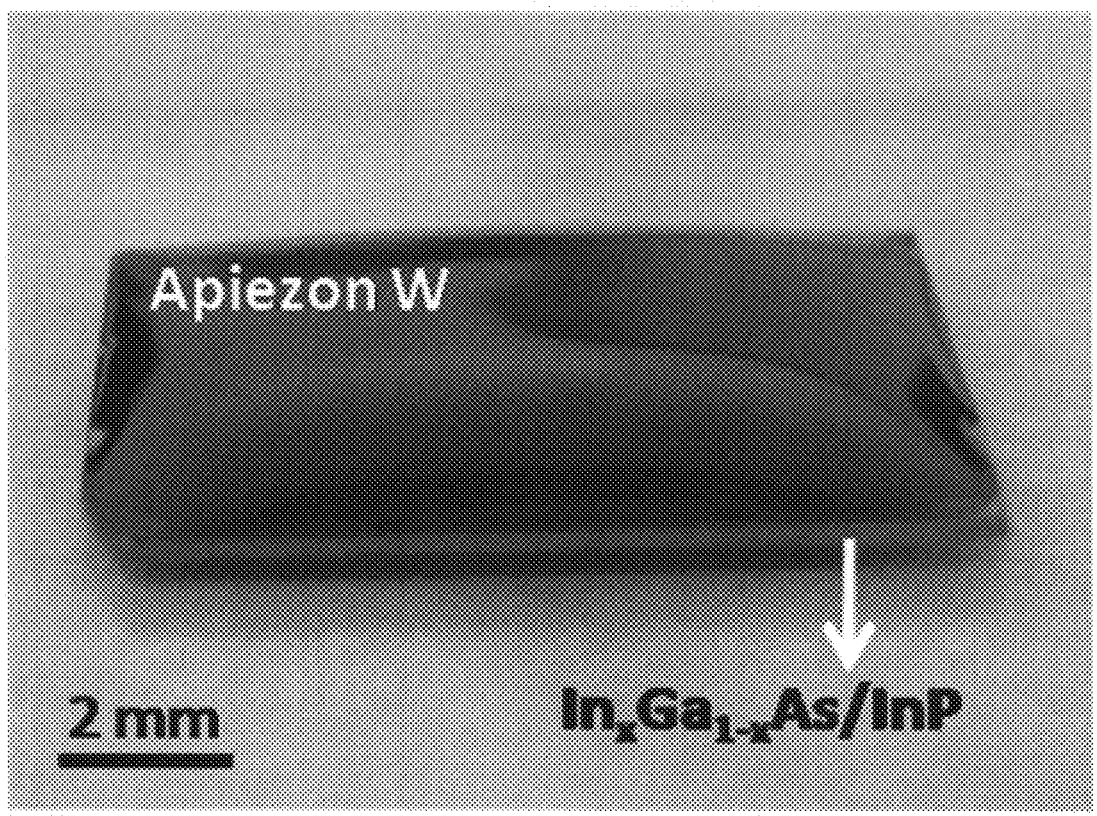
FIG. 7A is a photograph of an Apiezon wax/In$_x$Ga$_{1-x}$As/InP system according to an embodiment of the present invention.
Figure 7B:
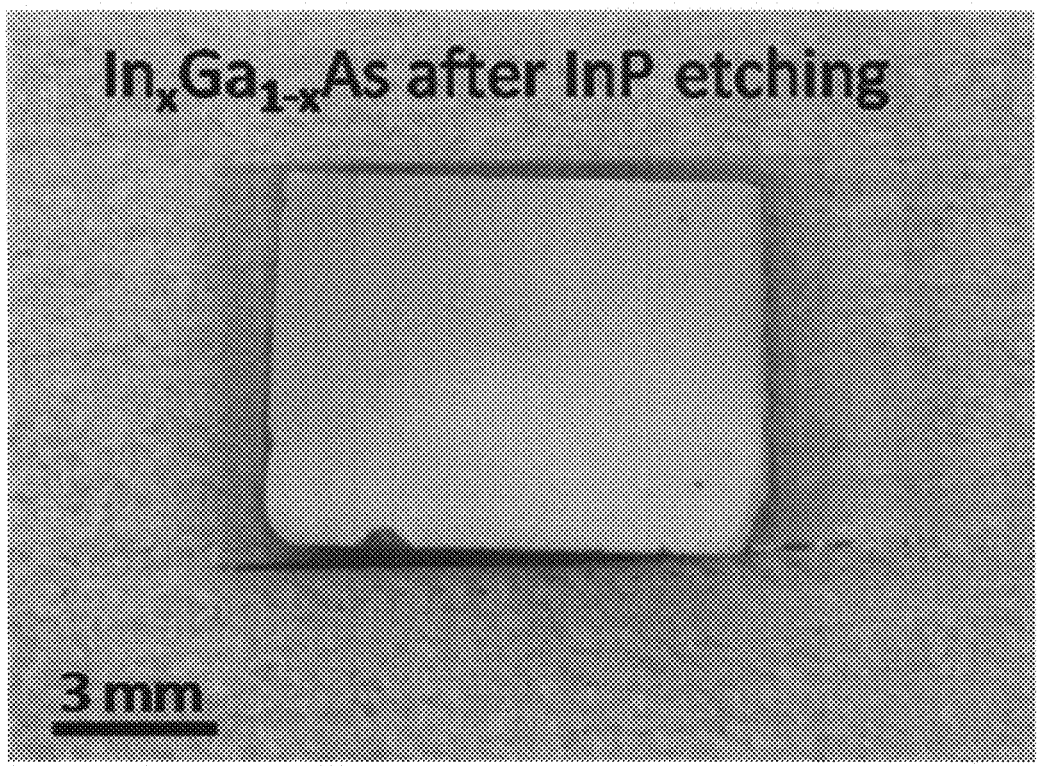
FIG. 7B is a photograph of the In$_x$Ga$_{1-x}$As film of FIG. 7A after substrate removal according to an embodiment of the present invention.

Because the grown film is generally very thin, e.g. about 40 nm, according to embodiments of the present invention, a transfer support may be first applied to the surface of the film before removing the initial growth substrate. The transfer support can be any material sufficient to provide support for the free film and enable handling of the thin film, and sufficiently flexible to allow the film to relax from the strained state to the relaxed state, in which the lattice parameters of the film relax to the bulk values predicted by Vegard's law. Suitable materials for the transfer support include flexible polymers and like substances, which allow enough movement to allow relaxation of the free film, but enough support to allow mechanical handling. Nonlimiting examples of suitable materials for the transfer support include waxes and greases, such as Apiezon® W, Apiezon® W40 (thin wax or heavy grease) and Apiezon® W100 (somewhat thicker grease than Apiezon® W40) (available from M&I Materials, Ltd.) and paraffin, as well as flexible polymers, such as polydimethylsiloxane (PDMS) and polyimide, adhesives (such as Crystalbond™ 509 (C509), a hard adhesive available from SPI Supplies) and adhesive tapes (such as Kapton® (available from E.I. du Pont de Nemours and Company) and vinyl tapes, and the like). A combination of transfer support materials may also be used, e.g., a combination of one or more of the Apiezon® materials (i.e., Apiezon® W, W40 and/or W100) and PDMS. Also, in some embodiments, a mechanical support (e.g., glass or the like) is used in addition to the transfer support to increase handling ability. In such an embodiment, the transfer support is placed on the grown film, and the mechanical support is placed on the transfer support. In such a configuration, the transfer support enables relaxation of the grown film, and the mechanical support enables easy handling of the free film. FIG. 7B shows an $In_xGa_{1-x}As$ film after removal of the InP initial growth substrate and including a glass mechanical support.

The method used to apply the transfer support to the grown film may vary as necessary depending on the material used for the transfer support, and any suitable method may be used. In some embodiments, however, the transfer support material is dissolved in a solvent prior to application to the grown film, then the solution is drop cast onto the film and the solvent is allowed to evaporate away, leaving a relatively thin layer of the transfer support. Any suitable solvent may used that is capable of dissolving the transfer support material. One nonlimiting example of a suitable solvent includes trichloroethylene (TCE). In some alternate embodiments, the transfer support may be applied by melting it directly onto the grown film. In some embodiments, for example, those using Crystalbond 509 or other hard adhesives, it may be desirable to melt the material directly onto the grown film, while in other embodiments, for example those using an Apiezon wax/grease, it may be desirable to dissolve the material in a solvent and apply the solution to the grown film. When using an adhesive tape, however, the material can be simply applied to the grown film without dissolution in a solvent or melting.

Additionally, the transfer support material may be cured after application. The curing may be conducted at any suitable temperature and for any suitable amount of time to effect the cure. As would be understood by those of skill in the art, the curing temperature and timing will depend on the selected transfer support material and its thermal properties. In some embodiments, for example, those structures including an Apiezon wax/grease as the transfer support material, the curing is performed at a temperature of about 100° C. for about 90 minutes.

Figure 10A:
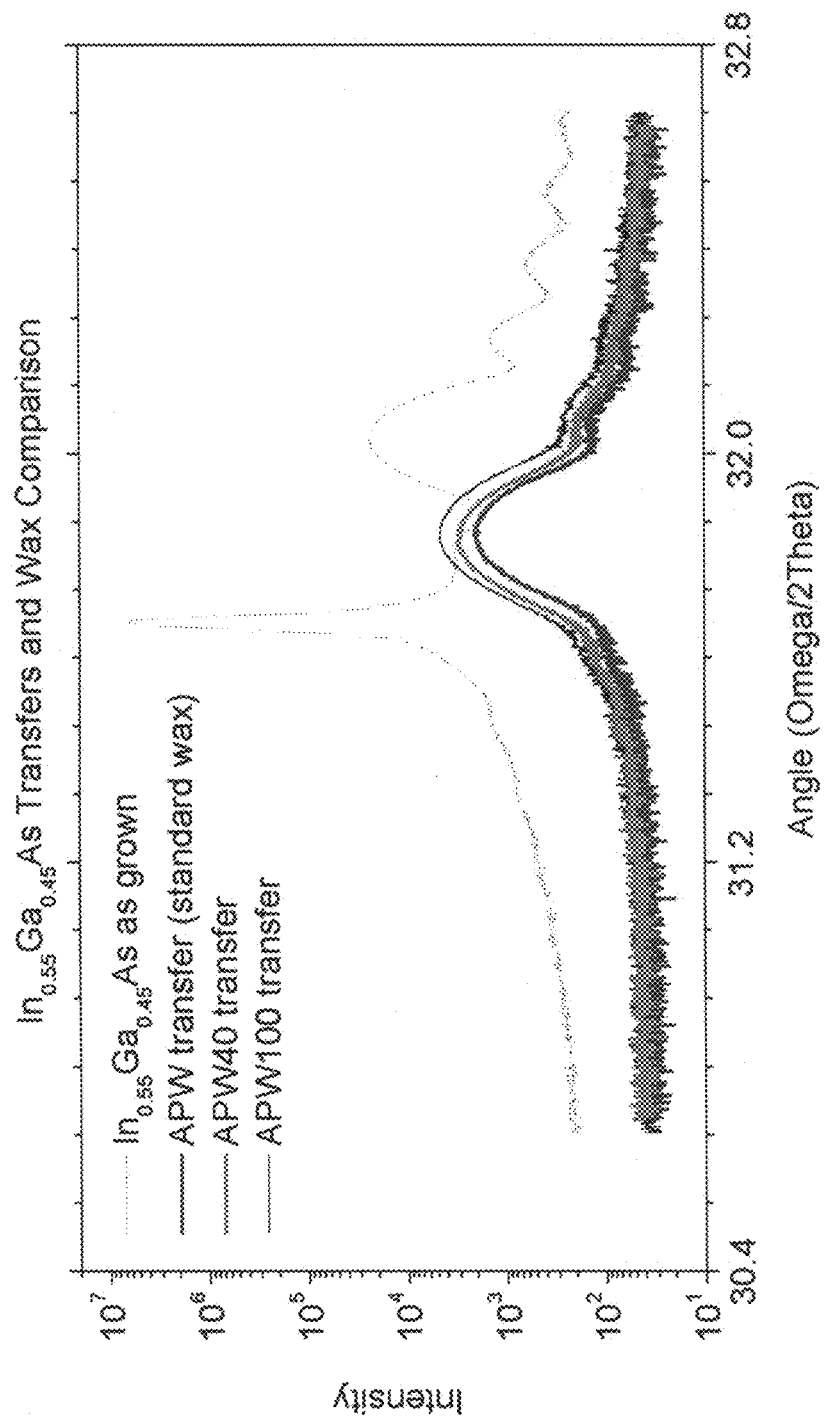
FIG. 10A is a graph comparing the X-ray diffraction data of a coherently-strained In$_{0.55}$Ga$_{0.45}$As film grown on an InP initial growth substrate to elastically-relaxed In$_{0.55}$Ga$_{0.45}$As films transferred to a handle support using Apiezon® W, W40 and W100 transfer support materials.
Figure 10B:
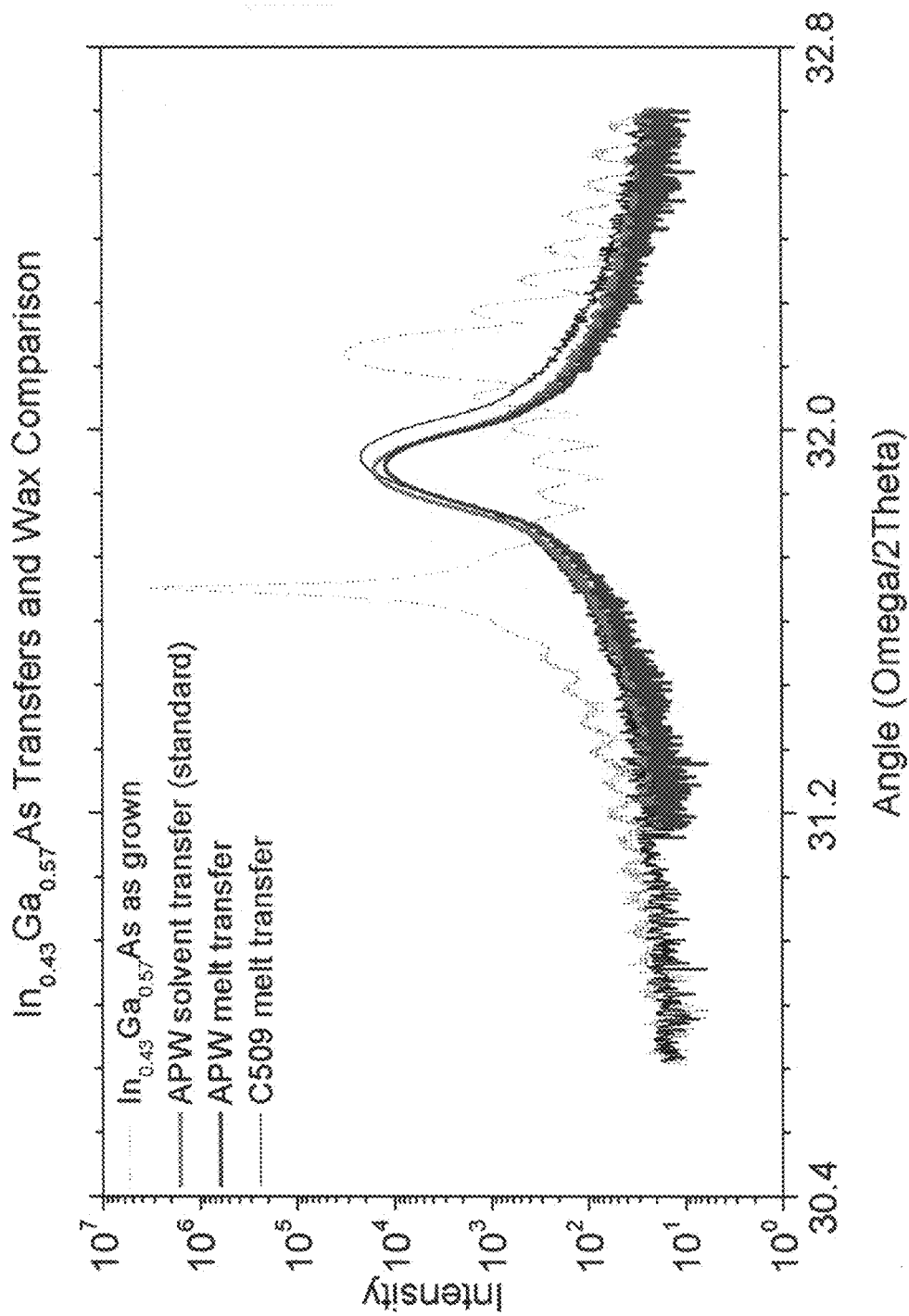
FIG. 10B is a graph comparing the X-ray diffraction data of a coherently-strained In$_{0.43}$Ga$_{0.57}$As film grown on an InP initial growth substrate to elastically-relaxed In$_{0.43}$Ga$_{0.57}$As films transferred to a handle support using Crystalbond 509 applied by direct melting, Apiezon® W applied by direct melting, and Apiezon® W applied by first dissolving in a solvent.

FIGS. 10A and 10B demonstrate that a wide variety of transfer support materials and methods of application for the transfer support material can be used to successfully relax the coherently-strained film upon removal of the initial growth substrate. In particular, FIG. 10A depicts X-ray diffraction data showing the successful transfer of 40 nm thick $In_{0.55}Ga_{0.45}As$ films (grown on InP initial growth substrates) using Apiezon® W, W40 and W100 waxes/greases. In FIG. 10A, each of the transfer support materials were applied by first dissolving the material in TCE, applying the solution to the grown film, and allowing the solvent to evaporate away. FIG. 10A also depicts X-ray data for a coherently-strained $In_{0.55}Ga_{0.45}As$ film on an InP substrate (labeled $In_{0.55}Ga_{0.45}As$ as grown). As shown in FIG. 10A, each of the $In_{0.55}Ga_{0.45}As$ films were successfully transferred from the InP substrate to a handle support (i.e., each of the films relaxed upon transfer). Accordingly, FIG. 10A shows that a variety of different transfer support materials can be used to successfully transfer (and relax) the grown films from the initial growth substrate to the handle support.

FIG. 10B depicts X-ray diffraction data showing the successful transfer of $In_{0.43}Ga_{0.57}As$ films (grown on InP initial growth substrates) using Apiezon® W and C509 applied to the grown film using different techniques. In particular, FIG. 10B shows the successful transfer of a film using Apiezon® W that was applied by first dissolving it in TCE and then applying it to the film and allowing the TCE to evaporate. FIG. 10B also shows the successful transfer of films using Apiezon® W and C509 that were applied by melting directly onto the grown film. Also, FIG. 10B depicts X-ray data for a coherently-strained $In_{0.43}Ga_{0.57}As$ film on an InP substrate (labeled $In_{0.43}Ga_{0.57}As$ as grown). Accordingly, FIG. 10B shows that different methods of applying the transfer support materials can be used to successfully transfer (and relax) the grown films from the initial growth substrate to the handle support. Although FIG. 10B appears to show a very slightly shifted peak for the film using the C509 transfer support, the date presented in the graph for that film does show that the film is substantially strain-relieved. Accordingly, while the results may appear slightly superior in the films using the Apiezon wax, the results also establish that the C509 transfer support also works.

Also, looking at FIGS. 10A and 10B together, it is shown that the inventive transfer technique is successful with a variety of different materials for the grown films. In particular, FIGS. 10A and 10B show the versatility of the transfer technique with at least $In_{0.43}Ga_{0.57}As$ and $In_{0.55}Ga_{0.45}As$ films. Also, the mechanical difficulty of this process is governed by the fragility and brittle nature of semiconductor films, and $In_xGa_{1-x}As$ films, such as those used in these examples are not especially or unusually strong or resistant to cracking compared to other semiconductor materials, as would be recognized by those of ordinary skill in the art. As such, the inventive method is applicable across the spectrum of semiconductor materials, and is not limited to the specific examples listed, as would be understood and expected by those of ordinary skill in the art.

The transfer support material may be applied on the grown film in a single layer, or in multiple layers. For example, in some embodiments, the transfer support material may be a wax/grease, adhesive or polymer that is applied in multiple layers to a desired thickness. The thickness of the applied transfer support is also not particularly limited, but is generally used in an amount and thickness sufficient to provide mechanical support for the handling of the film and to allow for relaxation of the film. In some embodiments, for example, the transfer support has a thickness ranging from about 0.5 mm to about 6 mm. In particular, in some embodiments in which the transfer support material is melted on the film, the thickness of the transfer support may range from about 1 mm to about 5 mm. In other embodiments, in which the transfer support is applied via solution to the film, the thickness of the transfer support may range from about 0.5 mm to about 3 mm. Additionally, in some embodiments in which an Apiezon material is used, the thickness of the transfer support may be from about 1 to about 3 mm, and the transfer support may have a dome shape, as shown in FIG. 7A. In other embodiments, for example embodiments using PDMS, the transfer support may have a thickness from about 1 mm to about 6 mm, and the transfer support may be uniform in thickness along the wafer, which is due to the curing process. See FIG. 7D. In some exemplary embodiments, the transfer support has a thickness of about 2 mm.

Application of the Relaxed Film to the Handle Support

Figure 2:
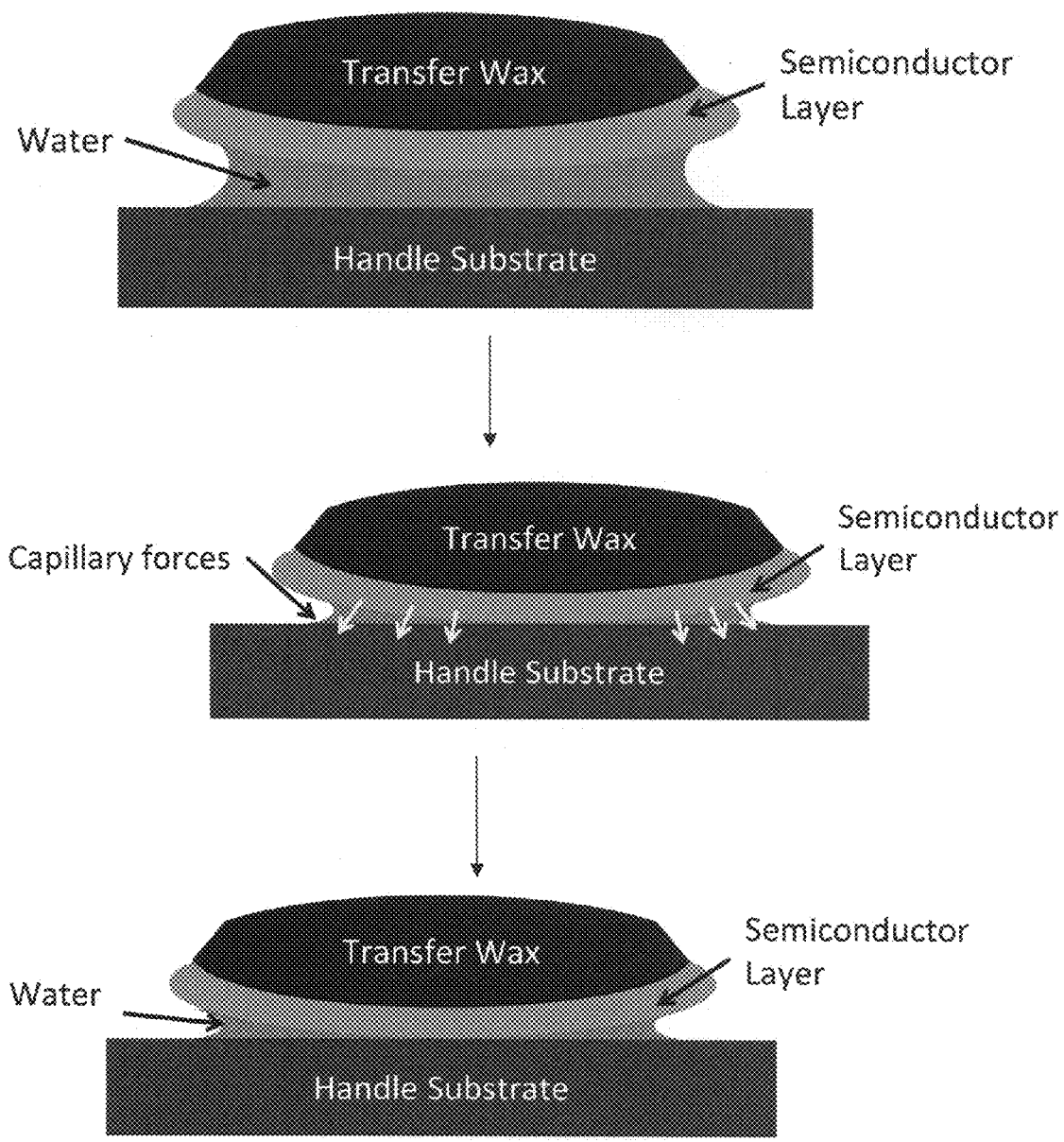
FIG. 2 is a schematic illustrating a process by which a strain-relieved single crystalline layer is applied to a handle support according to an embodiment of the present invention.

Upon removal of the initial growth substrate, the relaxed film/transfer support structure may take a curved configuration, as shown in FIG. 2. The curved configuration occurs because the grown film is very thin, but aids in the application of the film to the handle support. In particular, as shown in FIG. 2, to apply the film to the handle support, a thin coating of deionized water is applied to the film (e.g., by rinsing the film in the water) and then the coated film is applied to the handle support. Alternatively, the water can be applied to the handle support, or to both the film and the handle support. Upon application of the film to the handle support, van der Waals bonding occurs at room temperature between the film and the handle support (as shown in FIG. 2), and after a suitable period of time to allow bonding, the film is sufficiently bonded to the handle support.

The van der Waals bonding is allowed to occur for any amount of time suitable to complete the bonding procedure, for example, the bonding can be allowed to occur for a period of time of about 5 hours or longer, for example from about 5 hours to about 30 hours. In some exemplary embodiments, the bonding is allowed to occur for about 24 hours, but there is no particular upper limit to the amount of time for the bonding. In particular, no damage would be caused to the resulting structure from allowing the bond to cure for extended periods of time, and allowing the bond to form for a matter of days would also be suitable.

As noted above, the curved configuration of the film/transfer support structure aids the bonding procedure. In particular, upon applying the rinsed film to the handle support, the curved section of the film initially contacts the support and as the bonding continues, capillary forces pull the film toward the support from the curved region radially outward, as depicted in FIG. 2. This allows the film to bond to the handle support by gradually increasing the surface area of the contact, thereby substantially preventing the creation of trapped bubbles.

Figure 7C:
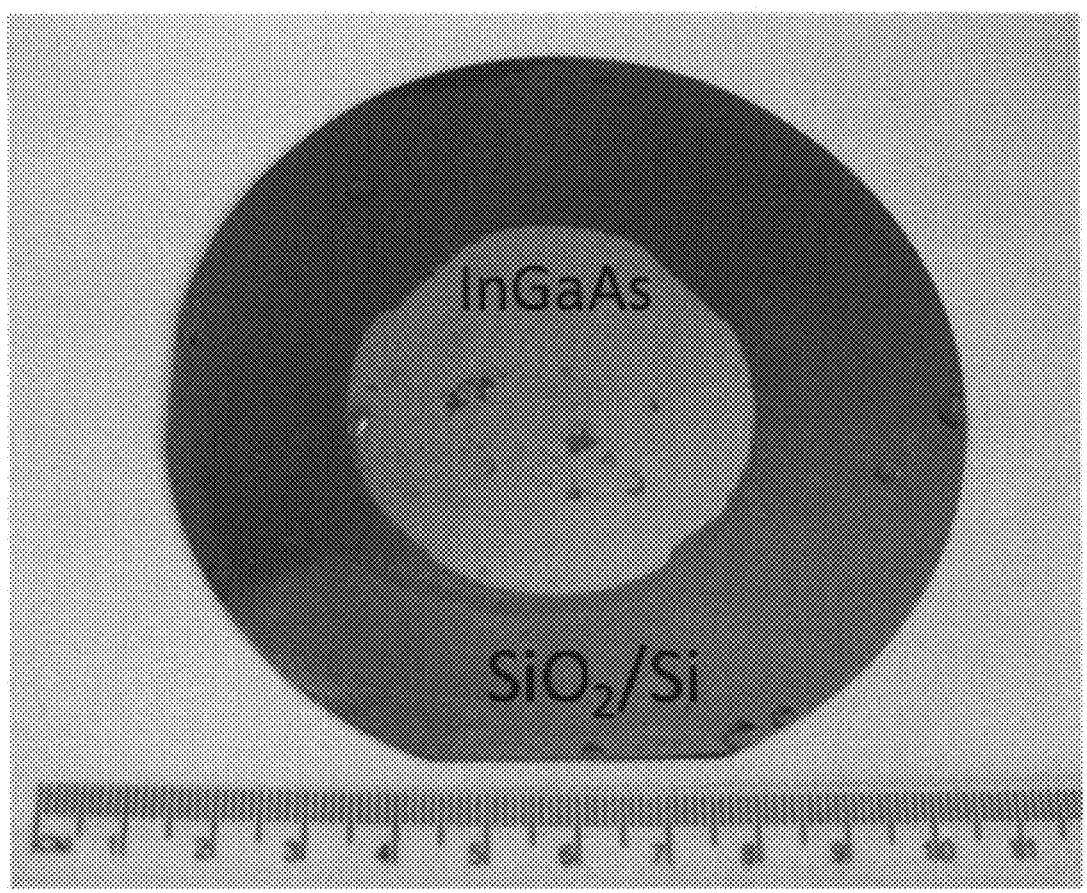
FIG. 7C is a photograph of a 50 mm diameter In$_x$Ga$_{1-x}$As film after transfer of the film to a SiO$_2$/Si handle support to fabricate a virtual substrate according to an embodiment of the present invention.
Figure 7D:
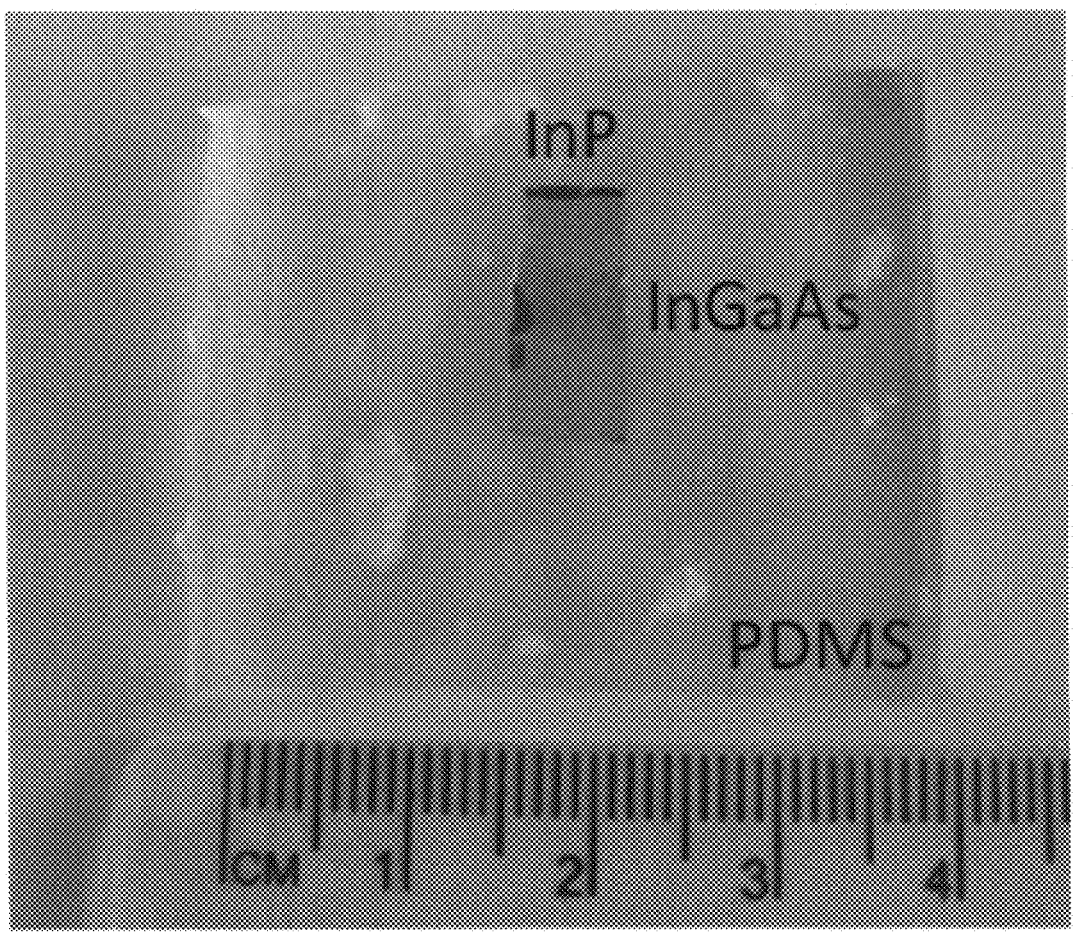
FIG. 7D is a photograph of a PDMS wax/In$_{0.45}$Ga$_{0.55}$As/InP system according to another embodiment of the present invention.

After bonding the film/transfer support structure to the handle support, the transfer support is removed from the structure to yield a virtual substrate including a handle support and a substantially strain-relieved single crystalline layer, as shown in FIG. 7C. Removal of the transfer support can be accomplished using any suitable technique. In some embodiments, for example, the transfer support is removed by chemical etching using a suitable solvent. As would be understood by those of ordinary skill in the art, the selection of the etching solvent or removal solvent will depend on the material used for the transfer support. In embodiments using a wax (e.g., Apiezon W, W40 or W100), for example, the etching solvent may be trichloroethylene (TCE) or the like. For embodiments using PDMS, the transfer support material may be removed by simply peeling off the PDMS layer. In embodiments using C509, for example, the solvent may be acetone or the like. Also, in embodiments using paraffin, the solvent may be hexane or other hydrocarbon solvent or like chemical. For embodiments using adhesive tape, the solvent will be specific to the adhesive of the tape, but in some examples may be HCl, acetone, limonene or other suitable chemical. Additionally, for embodiments using polyimide or other polymer, the removal may include plasma ashing or other high temperature process to degrade the polymer. After removal of the transfer support, the resulting film/handle support structure can be used as a template for further epitaxial growth.

Figure 6A:
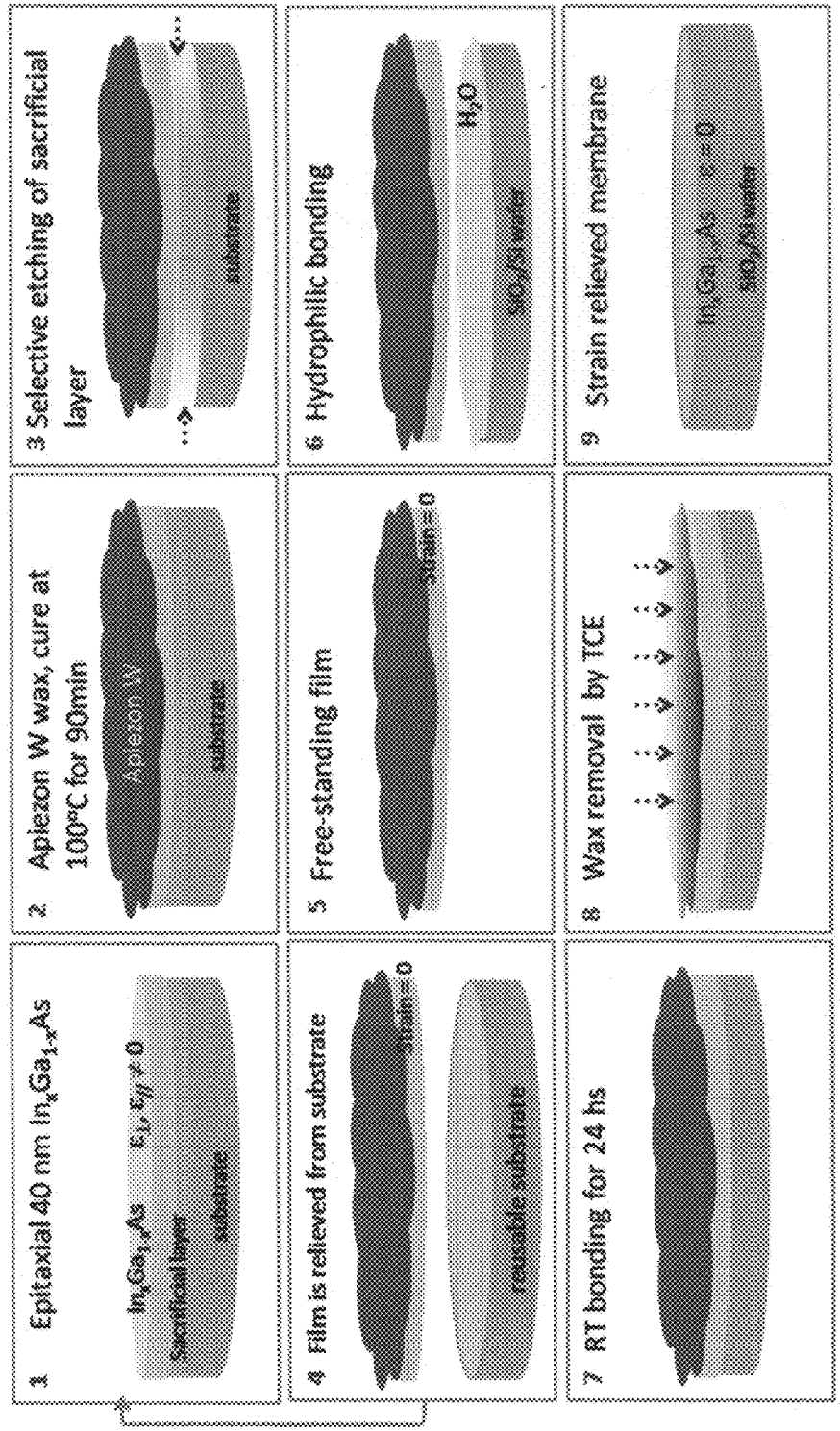
FIG. 6A is an illustration of a method of fabricating a virtual substrate according to another embodiment of the present invention.

In an alternate embodiment, as shown in FIG. 6A, a sacrificial layer is grown on the initial growth substrate prior to growing the coherently-strained film which is then grown on the sacrificial layer. After growing the coherently-strained film on the sacrificial layer, the transfer support is applied on the film, and then the sacrificial layer is removed by selective chemical etching. This method may be particularly desirable when using a initial growth substrate that is expensive because this method, termed "epitaxial liftoff," enables reuse of the initial growth substrate. Once the sacrificial layer is selectively removed, the initial growth substrate is separated from the film/transfer support structure, and the film/transfer support substrate is then applied to the handle support, and the transfer support removed by the same methods discussed above.

The selection of the sacrificial layer depends on the initial growth substrate and the coherently-strained film to be grown. The sacrificial layer can be any layer that can be grown lattice-matched to the initial growth substrate, or any layer that is strained without causing dislocations in the crystal layer that will ultimately form the virtual substrate. In general, the sacrificial layer can be any material that can be selectively etched, without damaging either the single crystalline layer or the initial growth substrate. The Clawson article, discussed above and incorporated herein by reference, discusses several wet chemical etching solutions that can be used for III-V semiconductor alloys. Also, the selection of a suitable sacrificial layer and the "epitaxial liftoff" procedure is discussed in more detail in Yablonovich, et al., "Extreme selectivity in the lift-off of epitaxial GaAs films," Appl. Phys. Lett., 51 (26), December 1987, the entire content of which is incorporated herein by reference. For example, in a structure using a GaAs substrate and a $In_xGa_{1-x}P$ film to be grown on the substrate, an AlAs sacrificial layer may be used. This method may also be used to make Si/Ge virtual substrates, for example by using a Ge rich SiGe alloy as the sacrificial layer, which can be selectively etched by hydrogen peroxide ($H_2O_2$). Alternatively, a $SiO_2$ sacrificial layer can be selectively etched by 10% HF from a SIMOX substrate.

Figure 6B:
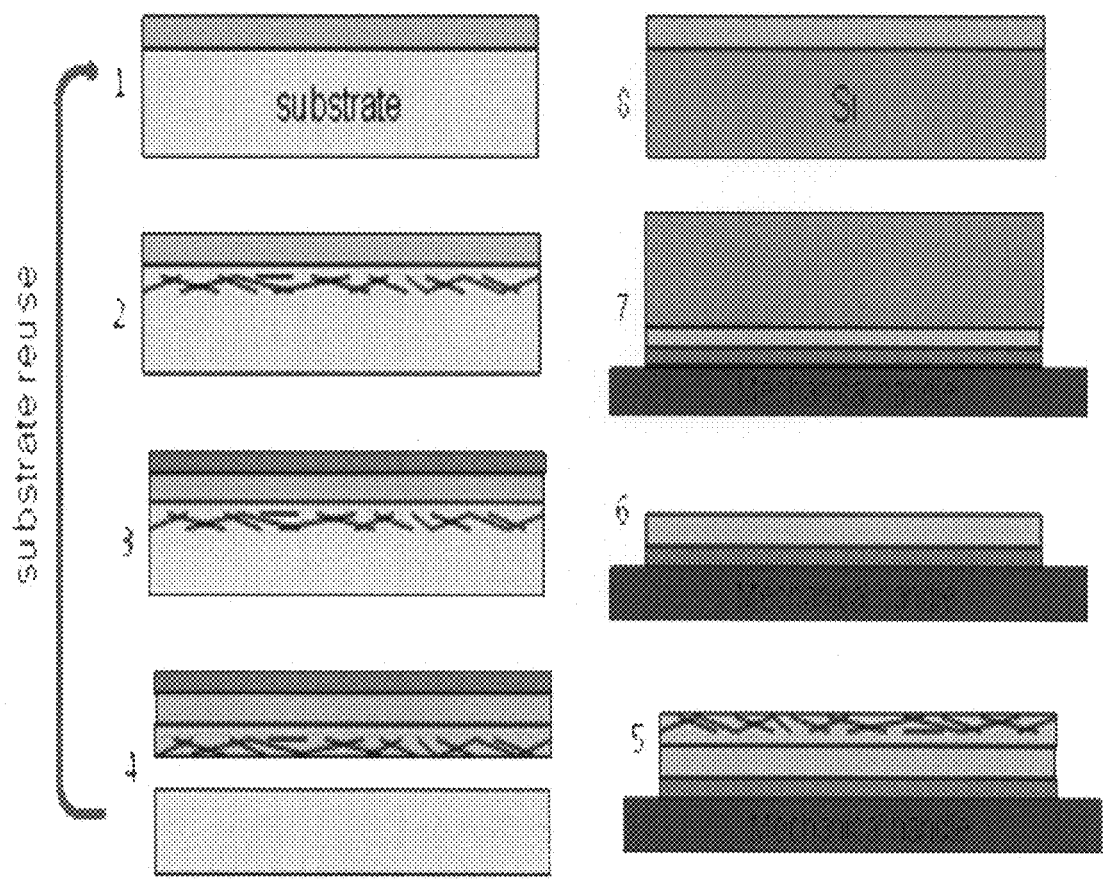
FIG. 6B is an illustration of a method of fabricating a virtual substrate according to another embodiment of the present invention.

In another alternate embodiment, as shown in FIG. 6B, a coherently-strained epitaxial thin layer (a "template layer") is grown on the initial growth substrate, as shown at 1 in FIG. 6B. Thin film growth may be accomplished by any epitaxial technique, such as metal organic chemical vapor deposition or molecular beam epitaxy. Then, $H^+$ or $He^+$ ions are implanted in the substrate for the eventual exfoliation of the template layer and a small amount of the substrate material, as shown at 2 in FIG. 6B. The implantation energy determines the substrate film thickness that will be exfoliated. The transfer support material, e.g. a polymer, is applied (e.g., by spin-coating) on the template layer's surface at a thickness of about 600 to about 700 nm, as shown at 3 in FIG. 6B. As discussed above, curing parameters will depend on the materials used. However, in some embodiments, curing may be performed at about 300° C. for about 30 minutes to allow layer exfoliation and reuse of the original initial growth substrate. A mechanical support, such as glass or another polymer is placed against the transfer support material, and the system is heated to cure the transfer support material and trigger layer exfoliation, a result of ion implantation. The result is a manageable ensemble formed by the handle+transfer support material+template layer+thin film of exfoliated initial growth substrate material. The initial growth substrate can be reused, decreasing considerably the cost of the virtual substrate. In FIG. 6B, the gray region is the initial growth substrate, the orange region is the coherently-strained layer (below critical thickness), the green region is the transfer support material (e.g., polyimide), the purple region is the mechanical handle (e.g., glass), and the blue region is the handle support (i.e., inexpensive substrate that is highly vacuum compatible).

The initial growth substrate film may be removed using a selective chemical etch to expose the template layer and elastically relax its strain. The template layer may then be bonded to an inexpensive handle support suitable for growth reactor processes, such as silicon. Next, the transfer support material (e.g., polymeric membrane) is removed by oxygen plasma cleaning, leaving the template layer at its natural lattice constant (as predicted by Vegard's law). This semiconductor layer can be used for the defect-free growth of additional epitaxial layers with this distinct lattice parameter. By selecting template layers of various composition, this growth template allows the growth and manipulation of high quality crystalline thin films with tunable lattice spacing.

As discussed above, the mechanical difficulty of the inventive methods is governed by the fragility and brittle nature of semiconductor films, and $In_xGa_{1-x}As$ films, such as those used in these examples are not especially or unusually strong or resistant to cracking compared to other semiconductor materials, as would be recognized by those of ordinary skill in the art. As such, the inventive methods are applicable across the spectrum of semiconductor materials, and are not limited to the specific examples listed, as would be understood and expected by those of ordinary skill in the art.

The following Examples are presented for illustrative purposes only, and do not limit the scope of the present invention.

Examples

Coherently-strained, 40 nm thick, dislocation-free, pseudomorphic $In_xGa_{1-x}As$ films with different In contents (x), were epitaxially grown on InP substrates. In particular, $In_xGa_{1-x}As$ films having In contents of 0.58 (or 58%), 0.48 (or 48%), 0.45 (or 45%) and 0.43 (or 43%) were grown on InP substrates. The resulting biaxially-strained $In_xGa_{1-x}As$ films assumed the same parallel lattice parameter of the InP substrate (i.e., $a_\parallel = a_{InP}$ and $\epsilon_\parallel, \epsilon_\perp \neq 0$). The in-plane strain ($\epsilon_\parallel$) between the films and the InP ranged from +0.3% to −0.7%, representing both tensile and compressive, coherently-strained films. Specifically, the 0.58 In content film had a strain value of −0.33%, the 0.48 In content film had a strain value of +0.35%, the 0.45 In content film had a strain value of +0.56% and the 0.13 In content film had a strain value of +0.70%. The $In_xGa_{1-x}As$ films were coated by a thermoplastic wax support to relax and handle the film. Once the film was coated with the wax, the InP was selectively etched, allowing for film relaxation. The $In_xGa_{1-x}As$ films are compressively strained with respect to the wax, and are thus more stable against crack formation, as shown in FIG. 1B. The relaxed films were then bonded to a handle support, e.g. $SiO_2/Si$, as shown in FIG. 1A. Upon removal of the wax, the templates were ready for epitaxial growth.

The epitaxial growth was accomplished by metalorganic chemical vapor deposition at 550° C. and a 3 Å/min growth rate, as shown in FIG. 5, step A. These conditions correspond to a kinetically controlled epitaxial growth regime, resulting in dislocation-free films. Four samples with different In contents (x) were grown with distinct in-plane strain values, i.e., $\epsilon_\parallel$=−0.33, +0.35, +0.56, +0.70%, as discussed above and corresponding to compressive and tensile films. The strained $In_xGa_{1-x}As$ films were initially coated with Apiezon W wax, which is dissolved in trichloroethylene (TCE) and applied in solution. Many layers of the wax were applied to the sample surface to create, in aggregate, a 2 mm thick wax layer, as shown in FIG. 5, step B. The wax was then cured at 100° C. for 90 min, and a glass slide was used to support the wax for handling purposes. The InP substrate was selectively etched at 5 µm/min using room temperature concentrated HCl, as shown in FIG. 5, step C. Strain relaxation occurred when the substrate was completely removed, and the $In_xGa_{1-x}As$ crystals assumed their bulk value, as predicted by Vegard's law. Once the InP substrate was removed, the thin film was rinsed in DI $H_2O$ and immediately placed into contact with the transfer support, e.g. $SiO_2/Si$, as shown in FIG. 5, step D. Van der Waals bonding was allowed to take place between the $In_xGa_{1-x}As$ film and the handle support for about 24 hours, after which time, the two materials were bonded. Because the wax has a thermal expansion coefficient ($6.20 \times 10^{-4\circ}$ $C.^{-1}$) two orders of magnitude larger than the semiconductor film ($5.66 \times 10^{-6\circ}$ $C.^{-1}$), it is under tension with respect to the film-ideal for layer relaxation independent of the original film strain configuration. The wax was then removed by trichloroethylene (TCE), as shown in FIG. 5, step E. After an appropriate cleaning procedure, the elastically-relaxed single crystal film was ready for epitaxial growth, as shown in FIG. 5, step F.

Figure 1C:
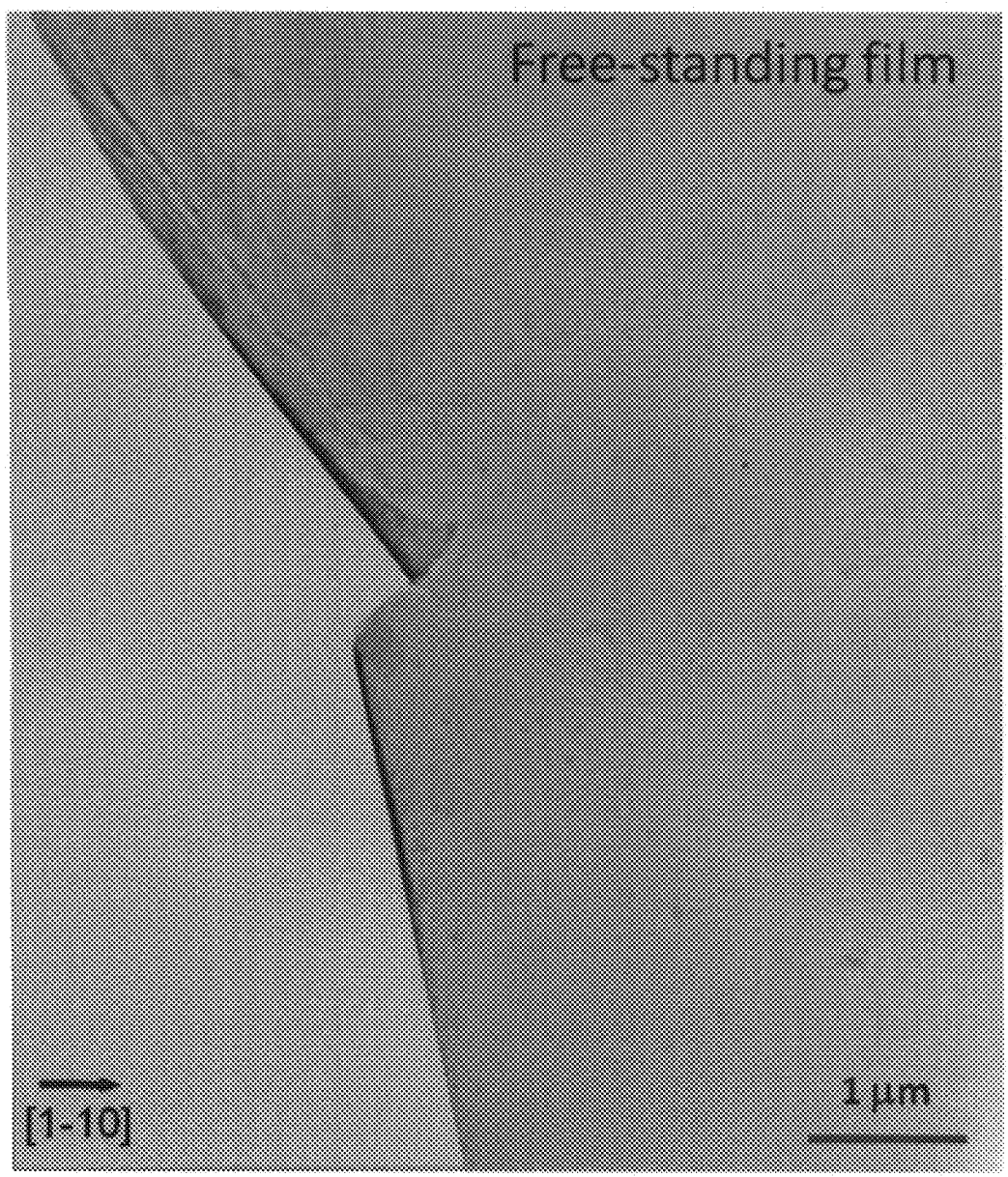
FIG. 1C is a plan view transmission electron microscopy image using g=<220>-type diffraction condition of an elastically-relaxed, free-standing $In_{0.43}Ga_{0.57}As$ film according to an embodiment of the present invention.
Figure 1D:
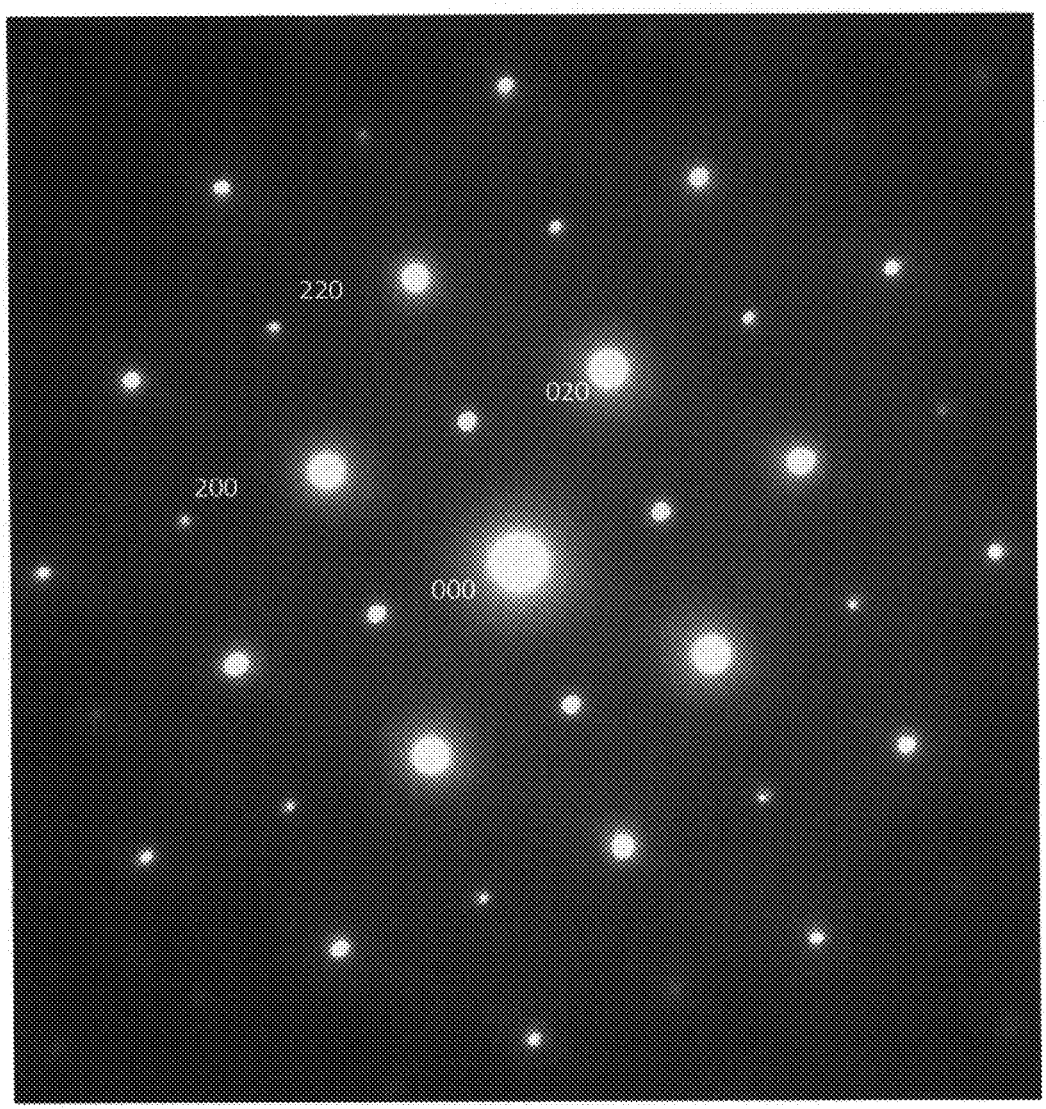
FIG. 1D is an electron diffraction pattern of the region shown in FIG. 1C.
Figure 1E:
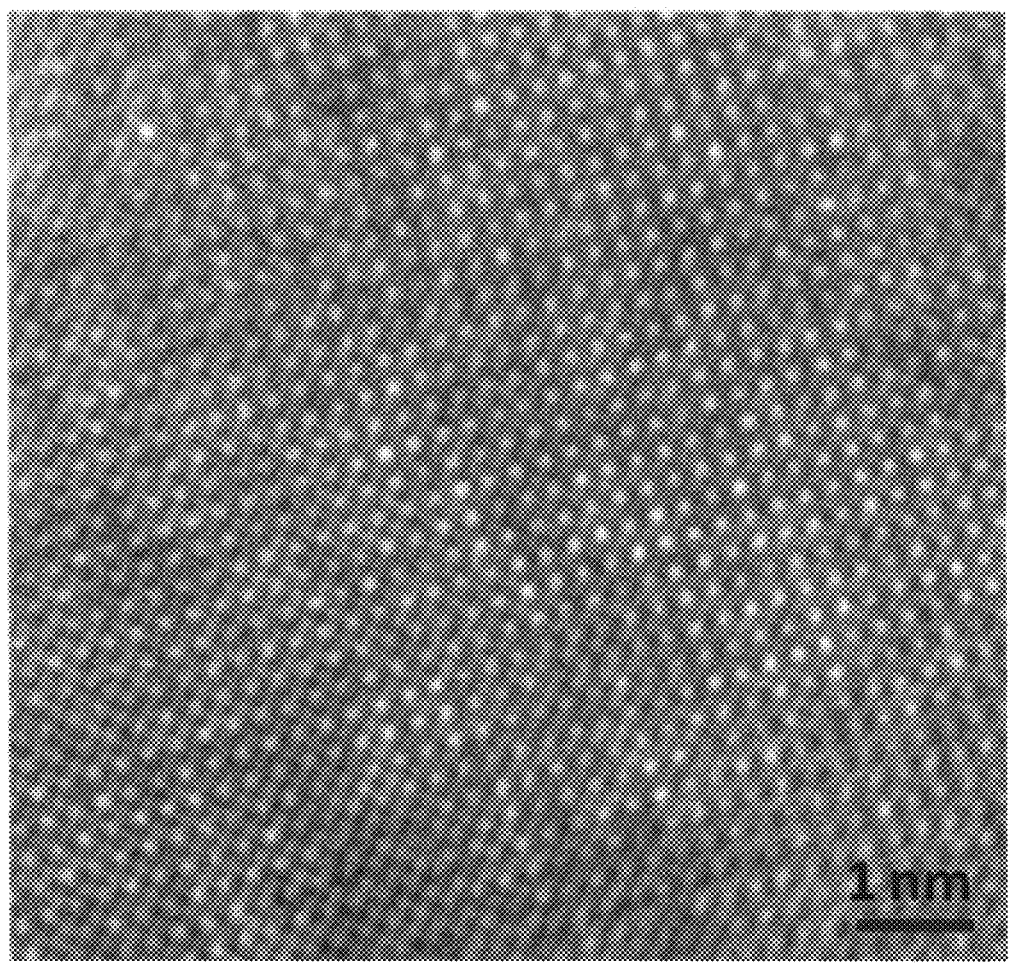
FIG. 1E is an atomic resolution plane view transmission electron microscopy image of the region shown in FIG. 1C.

The virtual substrate fabrication procedure can be scaled up to entire wafers, as illustrated in FIG. 1B (depicting an entire wafer). The plan view transmission electron microscopy image in FIG. 1C shows a free-standing piece of the relaxed $In_xGa_{1-x}As$ film free of cracks or dislocations. The absence of dislocations indicates that the relaxed film preserves the high quality of the original material. The well defined spots of the electron diffraction pattern in FIG. 1D confirm the good crystalline quality of the relaxed film, i.e., that the elastically-relaxed film is a defect-free single crystal. FIG. 1E displays an atomic resolution transmission electron microscopy image of a representative region of the virtual substrate; no defects were Observed. Additionally, the distance between the <001> projected atomic columns points out that the lattice parameter is equal to the bulk value, corresponding to relaxed $In_{0.43}Ga_{0.57}As$. Thus, the overall crystalline quality of the film is preserved by the inventive methods to achieve elastically-relaxed single crystalline layers.

Figure 2A:
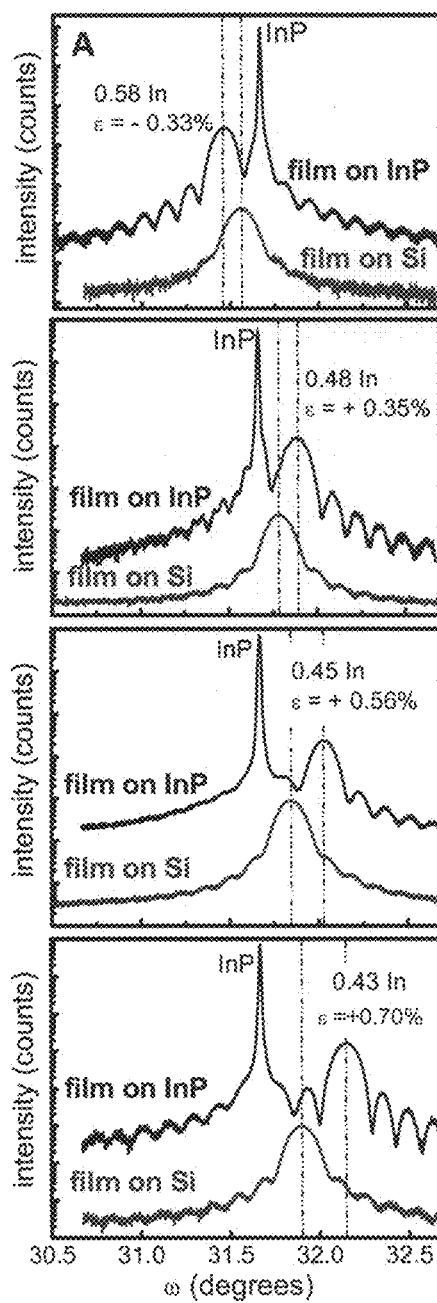
FIG. 2A depicts X-ray diffraction ω-2θ (0 0 4) scans of 40 nm thick $In_xGa_{1-x}As$ films (having varying In contents) on InP substrates (black line) and after bonding to $SiO_2/Si$ handle wafers (blue line).
Figure 2B:
FIG. 2B depicts reciprocal space maps for the $In_xGa_{1-x}As$ films of FIG. 2A before substrate removal. The color scale refers to the diffracted intensity.

The structural properties of the virtual substrate were determined by ω-2• scan X-ray diffraction measurements, which give statistical information about the lattice parameter of the film at different strain configurations. FIG. 2A shows (004) ω-2• scans for all samples before and after film transfer to a $SiO_2/Si$ handle support. In all cases, the distance between the InP (appearing as a sharp peak) and the 40 nm thick film (appearing as a broad peak) confirms that the $In_xGa_{1-x}As$ is originally coherently-strained with respect to the substrate. After transfer, a significant peak shift is observed, resulting from strain relief. The observed peak shift for all samples is due to material full relaxation. The width of the $In_xGa_{1-x}As$ peaks and the fringes confirm that the overall thickness of the film is preserved upon substrate removal. FIG. 2B shows reciprocal space maps for the coherently-strained $In_xGa_{1-x}As$ on InP, taken near the asymmetric (224) reflection. As can be seen from FIG. 2B, the 40 nm thick $In_xGa_{1-x}As$:InP film is coherently-strained in all cases. Specifically, the intense red peak in FIG. 2B corresponds to the substrate and appears in the same position for all samples. The strained layers appear shifted in both ω and 2• directions. The position of the film peak is used to infer the original in-plane strain values, as well as strained $a_\parallel$ and $a_\perp$ for all samples. FIG. 3 is a graphical representation of the inferred strain values. After the films are transferred to a the Si handle support wafer, a significant peak shift occurs in both ω and 2θ directions, as illustrated by the reciprocal space maps of FIG. 2C.

Figure 2C:
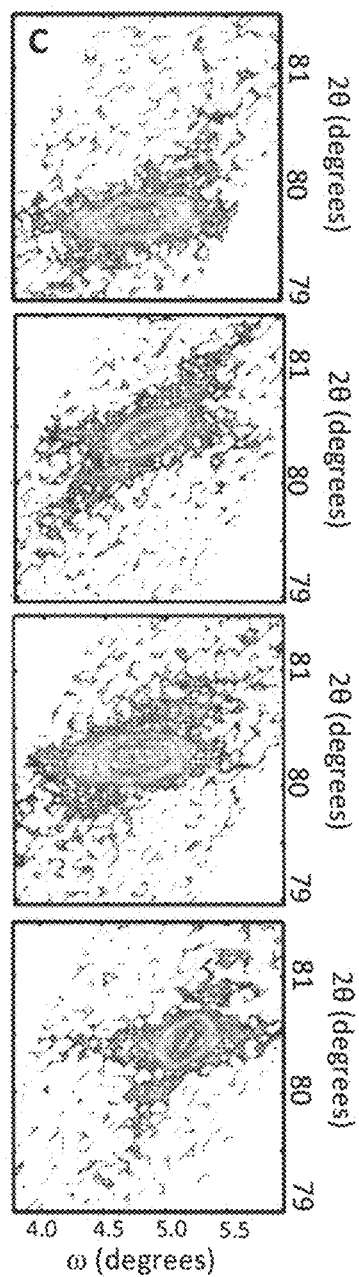
FIG. 2C depicts reciprocal space maps for the $In_xGa_{1-x}As$ films of FIG. 2A after the $In_xGa_{1-x}As$ films are transferred to a $SiO_2/Si$ handle support. The color scale refers to the diffracted intensity.
Figure 3:
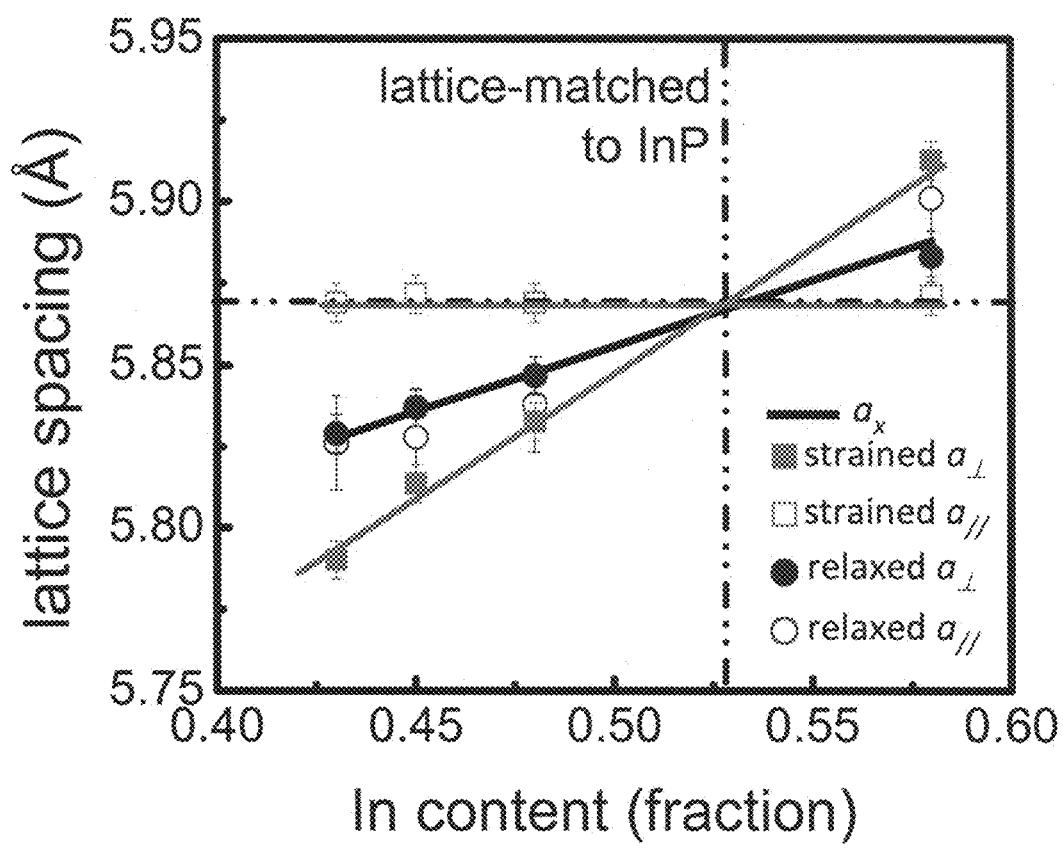
FIG. 3 is a graph of the material unit cell reconstructions showing the in-plane ($a_\parallel$) and out-of-plane ($a_\perp$) lattice parameters for strained $In_xGa_{1-x}As$:InP films and elastically-relaxed virtual substrates as a function of In content inferred from the X-ray diffraction measurements of FIG. 2.

Using the reciprocal space maps shown in FIGS. 2B and 2C, the strained and relaxed lattice parameters were quantified. In particular, the virtual substrate lattice parameter and film relaxation can be calculated from the measurements in FIG. 2C. For all samples, strained $a_\parallel$ was equal to $a_{InP}$, as a result of coherent epitaxial growth. To compensate for the in-plane distortion of the $In_xGa_{1-x}As$ lattice-mismatched to InP, the material unit cell also deforms in the out-of-plane direction, as shown in the graph of FIG. 3. After strain relief, the unit cells of the fabricated virtual substrates were reconstructed. Good agreement was found between the relaxed lattice parameters ($a_\parallel$, $a_\perp$) and the films natural lattice parameter (predicted by Vegard's law), as illustrated in FIG. 3. As discussed above, according to Vegard's Law, the material's natural lattice parameter ($a_{film}$) is given by the average of the lattice parameters of the elements constituting the alloy, compensated by the molar fraction of each species. For example, a film composed of $A_xB_{1-x}$ has a relaxed lattice parameter of $a_x = x \cdot a_A + (1-x) \cdot a_B$. The content of each element will dictate the lattice parameter ($a_x$) of the alloy and the difference between $a_\parallel$ and $a_{film}$ will determine the strain state of the film. These results demonstrate that full elastic relaxation was achieved for all samples, independent of its original strain configuration. Indeed, FIG. 3 demonstrates that full relaxation is achieved for different strain values, and the data is in very good agreement with ($a_x$) predicted by Vegard's Law (black solid line). The red solid lines refer to strained ($a_\parallel$) and ($a_\perp$) expected for coherent $In_xGa_{1-x}As$ grown on InP.

Figure 8:
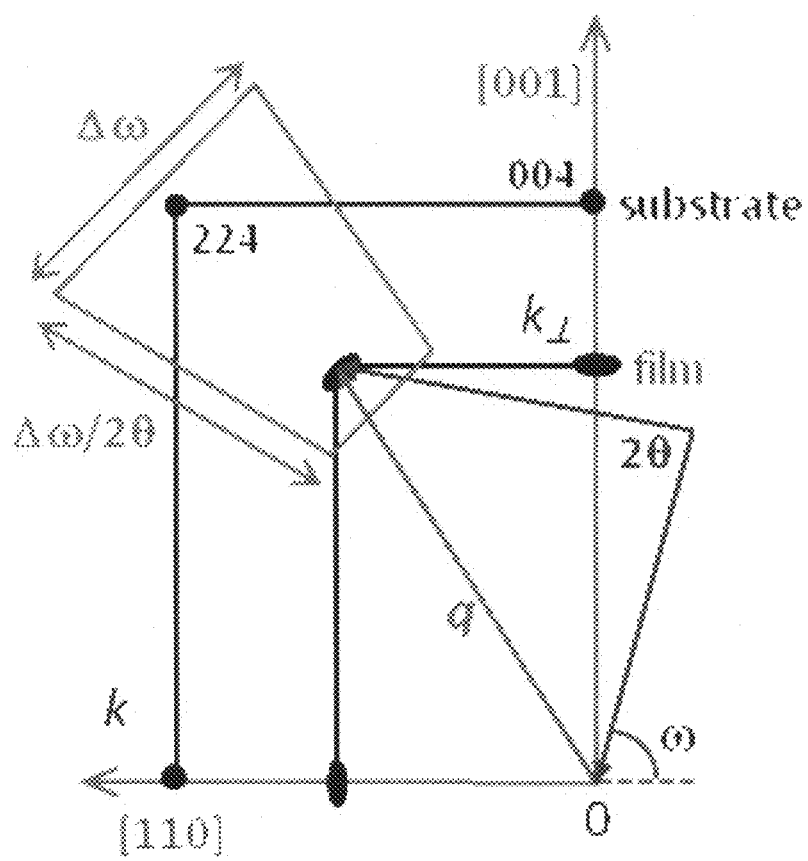
FIG. 8 is a scheme of X-ray diffraction geometry for reciprocal space maps measurements used to calculate the material unit cell before and after strain relaxation.

X-ray diffraction measurements were performed using a conventional Cu K• source (•=1.5406 Å and receiving slit=½°. In order to quantify the virtual substrate relaxation, reciprocal space maps were measured. Symmetric (004) and asymmetric (224) reflections were chosen for providing sufficient intensity and peak separation for zincblend crystal structures. FIG. 8 shows the reciprocal space geometry for glancing incidence scans, performed to reconstruct the virtual substrate unit cell. In FIG. 8, $k_i$ and $k_s$ are the entrance and exit wave vectors, q is the difference between $k_i$ and $k_s$, $k_\parallel$ and $k_\perp$ are the parallel and perpendicular components of q, 2θ is the diffracting angle, and ω is the angle between the incident X-ray beam and the Bragg planes. For a tetragonal film with no tilt, a (224) map is enough to reconstruct the crystal unit cell. The in-plane and out-of-plane components of the wave vector q can be calculated using Equations 1 and 2:

$$k_{//} = \frac{2}{\lambda}\sin(\theta_{224}^{sub} + \Delta\theta_{224}) \cdot \cos\left(\frac{\pi}{2} - (\phi - \Delta\omega_{224} + \Delta\omega_{004})\right) \quad (1)$$

$$k_{\perp} = \frac{2}{\lambda}\sin(\theta_{224}^{sub} + \Delta\theta_{224}) \cdot \sin\left(\frac{\pi}{2} - (\phi - \Delta\omega_{224} + \Delta\omega_{004})\right) \quad (2)$$

In Equations 1 and 2, $\theta^{sub}_{hkl}$ is the substrate Bragg angle, $\Delta\theta$ is the angular separation between the substrate and the film at the (224) reflection (<0 for compressive films and >0 for tensile films), $\phi$ is the angle between the (224) and (004) planes, $\Delta\bullet_{hkl}$ is the separation in • between substrate and film peaks for a (h k l) Bragg reflection (equal to zero for films with no tilt). Both $In_xGa_{1-x}As$ in-plane and out-of-plane lattice spacings ($a_{||}$ and $a_{\perp}$) can be calculated for a certain (h k l) Bragg condition using Equation 3:

$$a_{//} = \frac{\sqrt{h^2 + k^2}}{k_{//}}, \quad a_{\perp} = \frac{\sqrt{l^2}}{k_{\perp}} \quad (3)$$

Knowing $a_{\perp}$, $a_{||}$ and $a_x$ as predicted by Vegard's Law, the in-plane strain $\epsilon$ can be inferred from Equation 4:

$$\varepsilon = \frac{a_{//} - a_x}{a_x} \quad (4)$$

Thus, by combining reciprocal space maps at the (004) and (224) reflections, the initial strain values were calculated for all samples and the strain relaxation that occurred on the $In_xGa_{1-x}As$ virtual substrates were quantitatively determined.

Figure 4A:
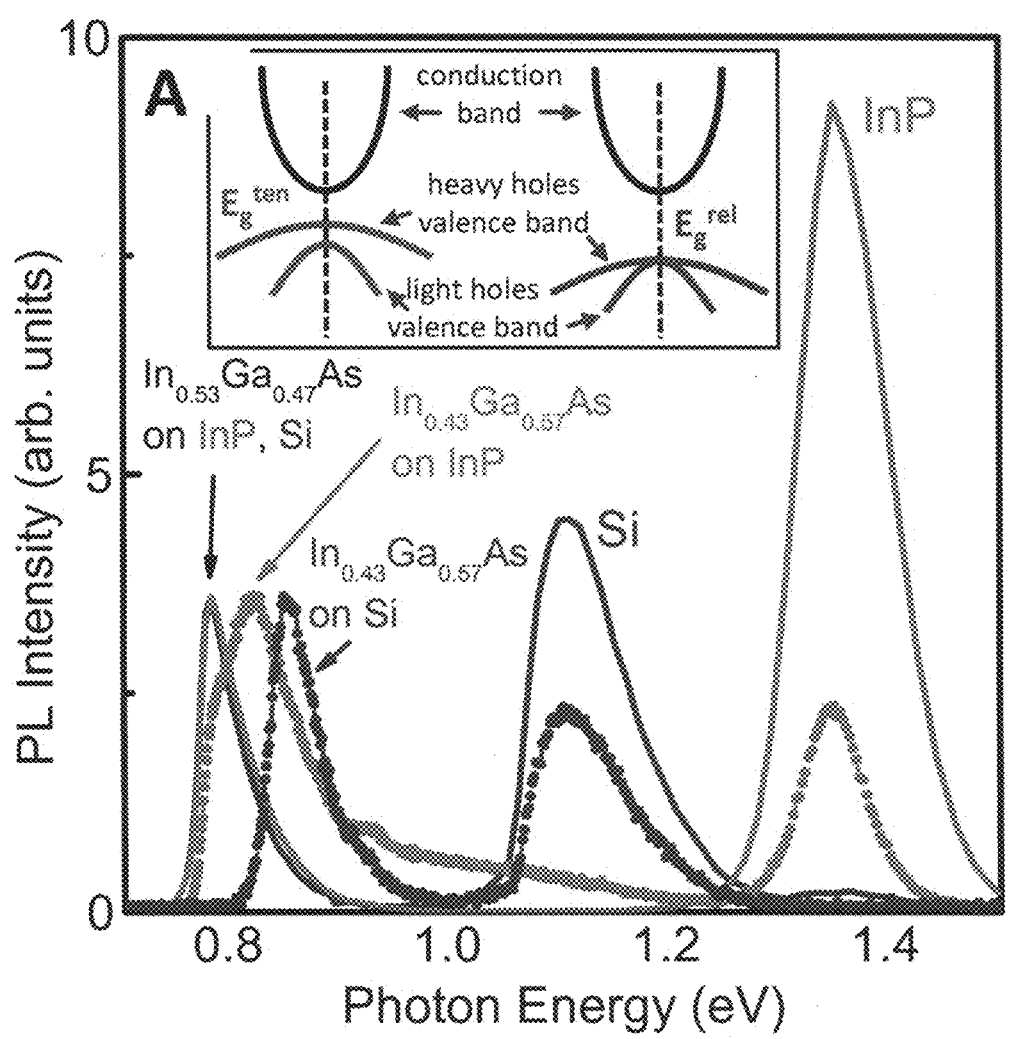
FIG. 4A is a graph of the room temperature photoluminescence (PL) measurements of $In_{0.43}Ga_{0.57}As$ films on InP (tensile) and on Si (elastically-relaxed), and of a lattice-matched $In_{0.53}Ga_{0.47}As$ film on InP and Si. The inset depicts a scheme of the light- and heavy-hole valence band splitting caused by tensile strain.

FIG. 4A shows the room temperature, steady-state photoluminescence observed from coherent $In_xGa_{1-x}As$ films grown on InP and the corresponding relaxed $In_xGa_{1-x}As$ films after transfer to $SiO_2/Si$. The readily observable photoluminescence signal of the 40 nm $In_xGa_{1-x}As$ layers at room temperature confirmed the high quality of the films. Lattice-matched $In_{0.53}Ga_{0.47}As$ films on InP showed nearly identical band edge photoluminescence intensities after transfer to $SiO_2/Si$, demonstrating that the optoelectronic properties of the film are preserved throughout the layer transfer process. Tensilely-strained $In_{0.43}Ga_{0.57}As$ films on InP exhibited a significant blue shift of the PL features upon transfer to $SiO_2/Si$ consistent with the strain relaxation observed in FIG. 3. The crystal lattice distortion on the tensile $In_{0.43}Ga_{0.57}As$ film splits the valence band degeneracy. Therefore, the band gap of a tensile film ($E_g^{ten}$) is smaller than the band gap of a relaxed film ($E_g^{rel}$). Because the $In_{0.53}Ga_{0.47}As$ film is lattice-matched to InP, no peak shift is observed.

Figure 4B:
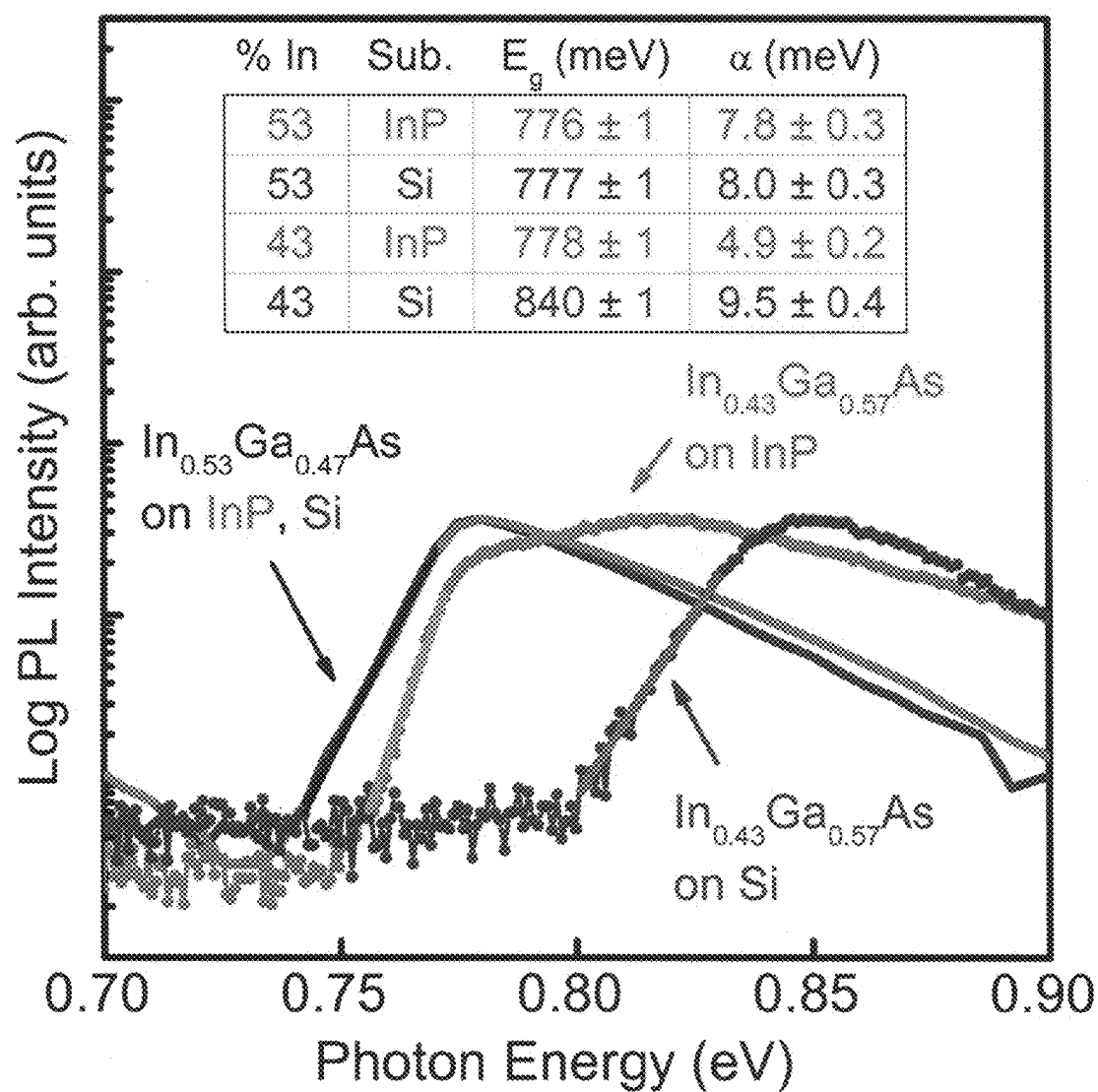
FIG. 4B is a zoom-in of the measurements in FIG. 4A with fits (solid black, orange and green lines) for the low energy portion of the spectrum (temperature independent) used to estimate $E_g$ for each strain configuration (values are shown on Table in inset).

FIG. 4B presents the fitting results from the low-energy portion of the PL signal using Equation 5:

Equation 5:

$$I(E) = A\exp\left(\frac{E - E_g}{\alpha}\right) \quad (5)$$

In Equation 5, A is a proportionality constant, $E_g$ is the band gap, and • is a tail fit parameter. Both coherently-grown and transferred $In_{0.53}Ga_{0.47}As$ films show values of $E_g$ and • comparable to the expected bulk parameters. The tensilely-strained $In_{0.43}Ga_{0.57}As$ films on InP have similar band gaps to the $In_{0.53}Ga_{0.47}As$ films but exhibit reduced •=4.9±0.2 in addition to an asymmetric peak shape, which is consistent with the expected splitting of the heavy- and light-hole valence bands caused by the biaxial crystal distortion (see FIG. 4A, inset). The band gap of the transferred $In_{0.43}Ga_{0.57}As$ film is $E_g$=840 meV, blue-shifted by ~60 meV from the tensilely-strained $In_{0.43}Ga_{0.57}As$ film. PL spectra of strained $In_xGa_{1-x}As$ films collected at room temperature show the effects of film relaxation upon layer transfer to $SiO_2/Si$ substrates.

Figure 9A:
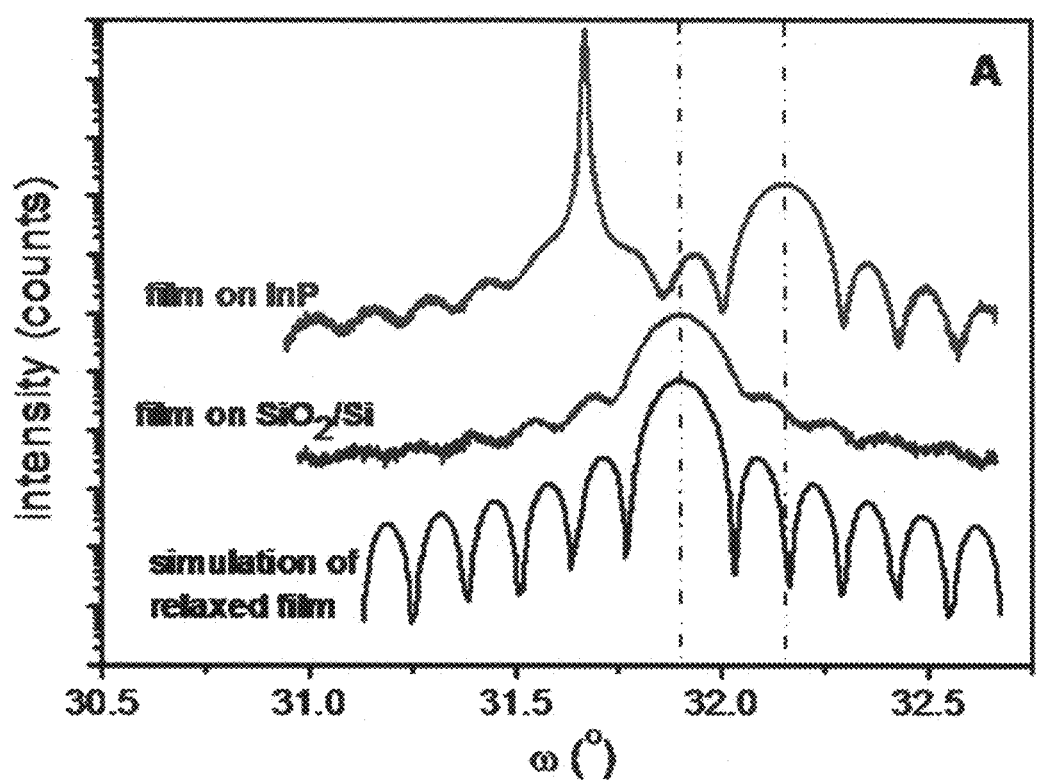
FIG. 9A depicts: 1) X-ray diffraction ω-2. (0 0 4) measurement of an In$_{0.43}$Ga$_{0.57}$As film on an InP substrate (in-plane strain=+0.71%) (top line), 2) X-ray diffraction ω-2. (0 0 4) measurement of the same In$_{0.43}$Ga$_{0.57}$As film after transfer to a SiO$_2$/Si handle substrate (middle line), and 3) X-ray diffraction ω-2. (0 0 4) simulation of a 40 nm thick free-standing In$_{0.43}$Ga$_{0.57}$As film.
Figure 9B:
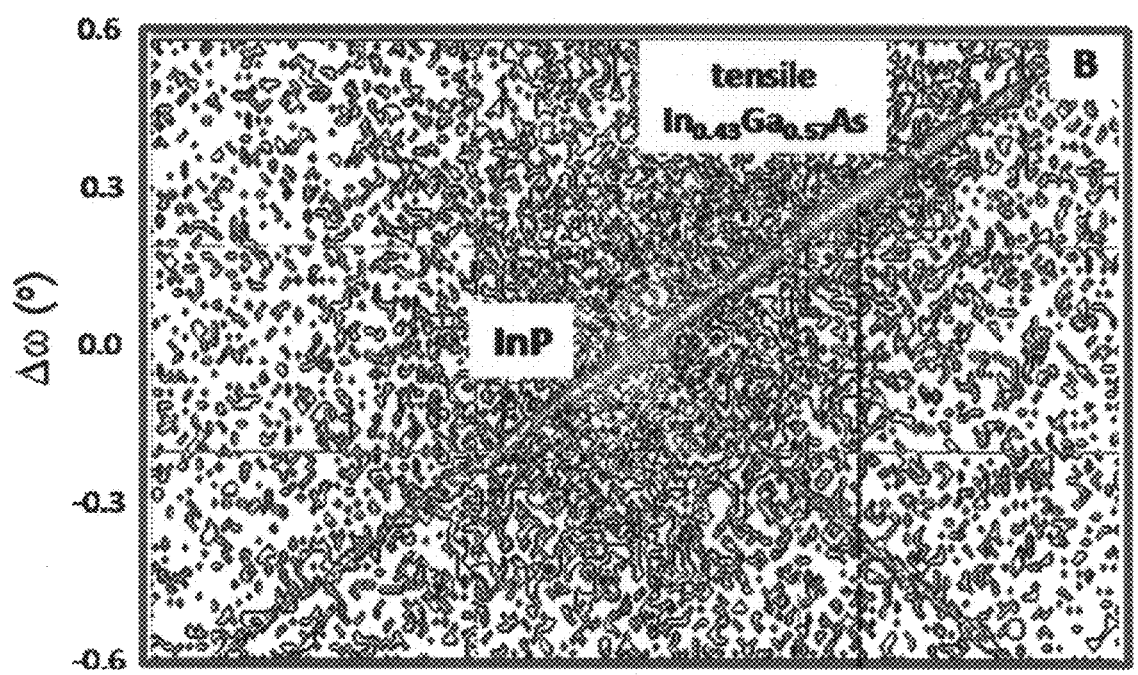
FIG. 9B is a reciprocal space map on (2 2 4) reflection showing a coherently-strained In$_{0.43}$Ga$_{0.57}$As layer under Bragg diffraction conditions, and an InP substrate peak as a reference.
Figure 9C:
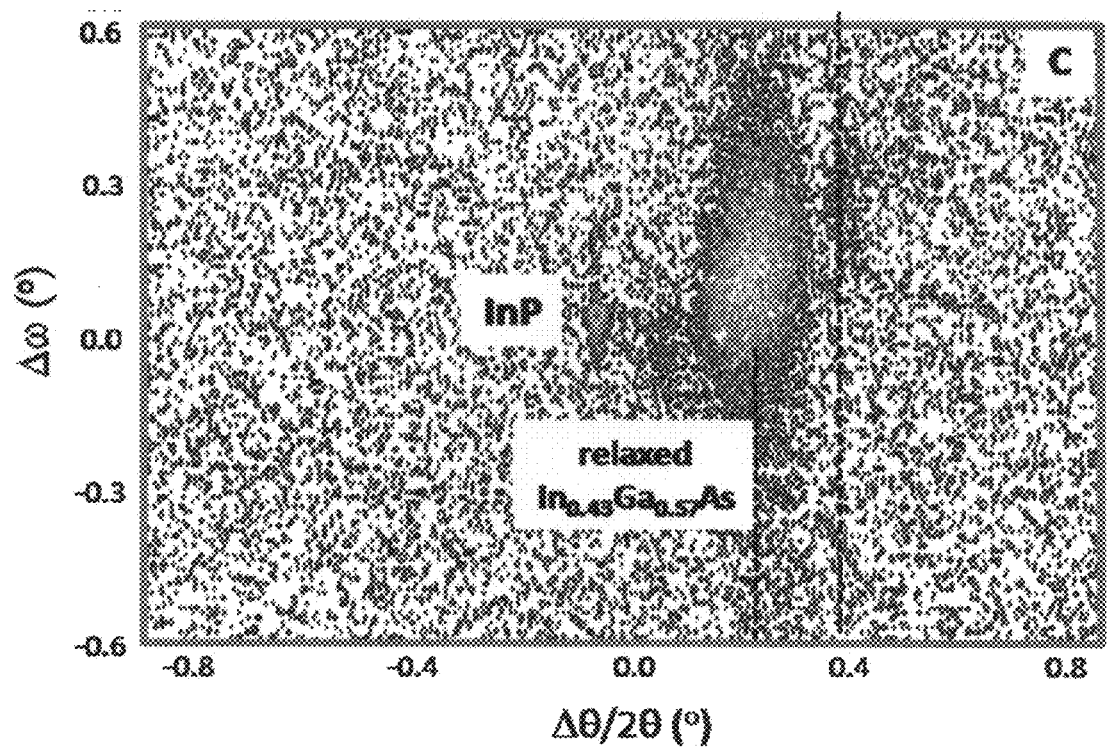
FIG. 9C is a reciprocal space map on (2 2 4) reflection of the elastically-relaxed In$_{0.43}$Ga$_{0.57}$As film of FIG. 9B obtained after film transfer, where the small InP peak refers to a substrate residue, used as a reference.

Using the techniques discussed above, both the tensile and compressed $In_xGa_{1-x}As$ virtual substrates were fabricated and measured by X-ray diffraction. This technique allows measurement of the in-plane and out-of-plane strains and reconstruction of the material unit cell. FIGS. 9A, 9B and 9C show these measurements for an $In_{0.43}Ga_{0.57}As$ virtual substrate as a representative example. The $In_xGa_{1-x}As$ film was relieved from the InP substrate and bonded to a $SiO_2/Si$ handle support, and the film peak shift observed in FIG. 9A corresponds to the material's full relaxation. This shift is in agreement with a simulation for a fully relaxed or free-standing $In_{0.43}Ga_{0.57}As$ film.

Virtual substrate in-plane and out-of-plane lattice parameters ($a_{||}$ and $a_{\perp}$, respectively) can be calculated by measuring reciprocal space maps at an asymmetric reflection, such as (2 2 4). FIGS. 9B and 9C show the film peak shift in both $\omega$ and 2• directions, indicating again that the film relaxed. The $a_{\perp}$ and $a_{||}$ parameters were found to be 5.82791 and 5.82602 Å, resulting in $\epsilon_{||}$=−0.03±0.05% and relaxation of 103±5%. Full relaxation was also achieved for $In_xGa_{1-x}As$ films with compressive and different tensile strain values and their unit cells are in agreement with Vegard's Law prediction, as shown in FIG. 3 (depicting that different $In_xGa_{1-x}As$ alloy compositions (and strain values) completely relax, assuming the lattice parameter predicted by Vegard's Law).

The search for a dislocation-free crystalline template has been a "holy grail" objective in the field of materials science for more than 20 years because success in this endeavor enables the synthesis of a very large variety of strain-free crystals at lattice parameters other than those achievable via bulk crystal growth. The inventive virtual substrates are applicable across a wide spectrum of semiconductor materials, including III-V, II-VI and IV-IV semiconductors and ceramics. The creation of a template that can be used for epitaxial growth has the potential to enable new crystalline material growth that can be used as a building block for innovative optoelectronic designs for semiconductor heterostructures that require tunable lattice parameters and band structures, such as light-emitting diodes, photodetectors and semiconductor lasers with frequency operation that are currently difficult to fabricate, thin film solar cells that absorb photons with specific energies, flexible electronics and woodpile-structure three-dimensional photonic crystals.

Additionally, the inventive virtual substrates and methods have promising commercial utility for III-V multi-junction solar cells and other applications. The virtual substrates allow selection of a lattice constant that supports defect-free growth of semiconductor crystalline thin films with different band gap energies. This facilitates the design and growth of semiconductor devices with band gap combinations not currently achievable in low-defect form and frees the design space from the restrictions imposed by the limited variability of lattice spacing presented by current growth substrates.

While the present invention has been illustrated and described with reference to certain exemplary embodiments, those of ordinary skill in the art will understand that various modifications and changes may be made to the described embodiments without departing from the spirit and scope of the present invention, as defined in the following claims.

What is claimed is:

1. A substrate, comprising:
a handle support; and
a single crystalline layer on the handle support, wherein the single crystalline layer is substantially elastically relaxed.

2. The substrate of claim 1, wherein the single crystalline layer is completely elastically relaxed.

3. The substrate of claim 1, wherein the single crystalline layer comprises a material selected from the group consisting of III-V semiconductor materials, II-VI semiconductor materials, IV-IV semiconductor materials, and ceramic semiconductor materials.

4. The substrate of claim 3, wherein the single crystalline layer comprises a III-V semiconductor material.

5. The substrate of claim 4, wherein the single crystalline layer comprises an alloy of In, Ga and As.

6. The substrate of claim 1, wherein the handle support comprises Si.

7. The substrate of claim 1, wherein the handle support comprises a $SiO_2$/Si substrate.

8. A substrate, comprising:
a substantially planar handle support; and
a single crystalline layer on the handle support, wherein the single crystalline layer is substantially elastically relaxed.

9. The substrate of claim 8, wherein the single crystalline layer is completely elastically relaxed.

10. The substrate of claim 1, wherein the single crystalline layer is substantially defect-free.

11. The substrate of claim 8, wherein the single crystalline layer is substantially defect-free.

* * * * *